US009882020B2

(12) United States Patent
Padmanabhan et al.

(10) Patent No.: US 9,882,020 B2
(45) Date of Patent: Jan. 30, 2018

(54) CASCODE CONFIGURED SEMICONDUCTOR COMPONENT

(71) Applicant: Semiconductor Components Industries, LLC, Phoenix, AZ (US)

(72) Inventors: Balaji Padmanabhan, Tempe, AZ (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/209,541

(22) Filed: Jul. 13, 2016

(65) Prior Publication Data
US 2017/0025404 A1    Jan. 26, 2017

Related U.S. Application Data

(60) Provisional application No. 62/196,658, filed on Jul. 24, 2015.

(51) Int. Cl.
| | | |
|---|---|---|
| *H01L 29/15* | (2006.01) | |
| *H01L 31/0256* | (2006.01) | |
| *H01L 29/66* | (2006.01) | |
| *H01L 29/78* | (2006.01) | |
| *H01L 29/417* | (2006.01) | |

(Continued)

(52) U.S. Cl.
CPC .... *H01L 29/66462* (2013.01); *H01L 27/0266* (2013.01); *H01L 29/2003* (2013.01); *H01L 29/205* (2013.01); *H01L 29/41758* (2013.01); *H01L 29/66537* (2013.01);

(Continued)

(58) Field of Classification Search
CPC ............ H01L 27/0274; H01L 29/7823; H01L 29/7825; H01L 29/66704; H01L 29/66462; H01L 29/41758; H01L 29/2003; H01L 29/205; H01L 29/7787; H01L 29/66537
See application file for complete search history.

(56) References Cited

U.S. PATENT DOCUMENTS 7,576,388 B1 *   8/2009   Wilson ................. H01L 29/407
                                                          257/330
7,977,193 B1 *   7/2011   Disney ................. H01L 29/407
                                                          257/E29.257

(Continued)

*Primary Examiner* — Victor A Mandala
(74) *Attorney, Agent, or Firm* — Rennie William Dover

(57) ABSTRACT

In accordance with an embodiment, a cascode connected semiconductor component and a method for manufacturing the cascode connected semiconductor component are provided. The cascode connected semiconductor component has a pair of silicon based transistors, each having a body region, a gate region over the body region, a source region and a drain. The source regions of a first and second silicon based transistor are electrically connected together and the drain regions of the first and second silicon based transistors are electrically connected together. The gate region of the second silicon based transistor is connected to the drain regions of the first and second silicon based transistors. The body region of the second silicon based transistor has a dopant concentration that is greater than the dopant concentration of the first silicon based transistor. A gallium nitride based transistor has a source region coupled to the first and second silicon based transistor.

20 Claims, 32 Drawing Sheets

(51) Int. Cl.
    *H01L 29/20*       (2006.01)
    *H01L 29/205*    (2006.01)
    *H01L 29/778*    (2006.01)
    *H01L 27/02*      (2006.01)

(52) U.S. Cl.
    CPC .... *H01L 29/66704* (2013.01); *H01L 29/7787* (2013.01); *H01L 29/7823* (2013.01); *H01L 29/7825* (2013.01)

(56) References Cited

U.S. PATENT DOCUMENTS

| | | | |
|---|---|---|---|
| 8,304,829 B2 * | 11/2012 | Yedinak | H01L 29/0696 257/301 |
| 9,252,147 B2 * | 2/2016 | Dutta | H01L 21/823857 |
| 2010/0123220 A1 | 5/2010 | Burke et al. | |
| 2011/0006351 A1 * | 1/2011 | Kunii | H01L 27/0207 257/296 |
| 2011/0133251 A1 | 6/2011 | He | |
| 2013/0069208 A1 | 3/2013 | Briere | |
| 2013/0088280 A1 | 3/2013 | Lal et al. | |
| 2013/0302958 A1 | 11/2013 | Hossain et al. | |
| 2013/0328122 A1 * | 12/2013 | Li | H01L 29/407 257/334 |
| 2015/0023105 A1 * | 1/2015 | Widjaja | G11C 11/404 365/185.18 |
| 2015/0054038 A1 * | 2/2015 | Masliah | H03F 1/0266 257/262 |
| 2016/0260700 A1 * | 9/2016 | Huang | H01L 27/0255 |

\* cited by examiner

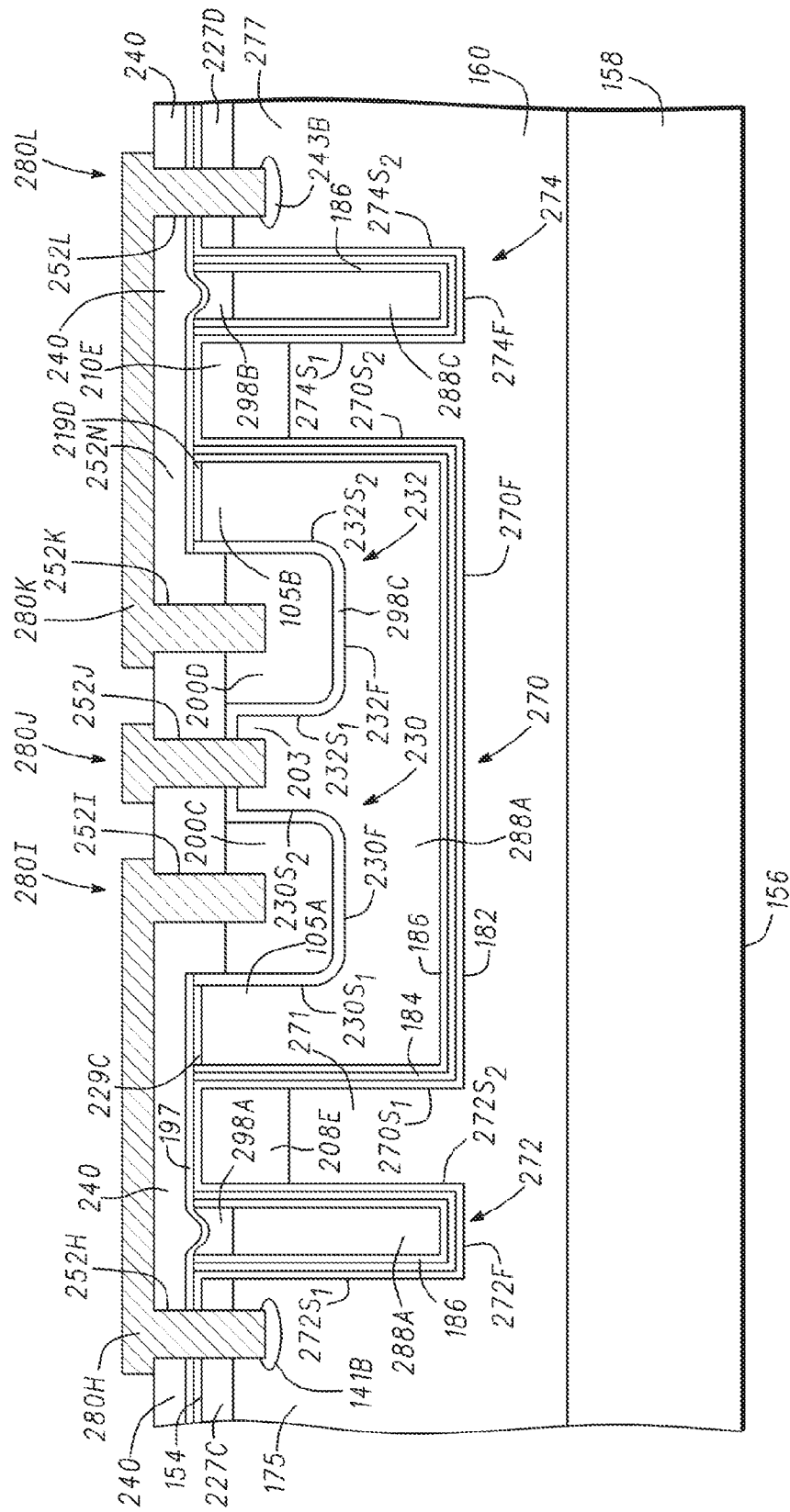

US 9,882,020 B2

1

CASCODE CONFIGURED SEMICONDUCTOR COMPONENT

The present application is a nonprovisional application of Provisional Patent Application No. 62/196,658 filed on Jul. 24, 2015, by Balaji Padmanabhan et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs), High Electron Mobility Transistors (HEMTs), etc. Devices such as diodes, Schottky diodes, and FETs were typically manufactured from a silicon substrate. Drawbacks with semiconductor devices manufactured from a silicon substrate include low breakdown voltages, excessive reverse leakage current, high drain to source resistance (Rds(on)), unsuitably poor switching characteristics, low power densities, and high costs of manufacture. To overcome these drawbacks, semiconductor manufacturers have turned to manufacturing semiconductor devices from compound semiconductor substrates such as, for example, III-N semiconductor substrates, III-V semiconductor substrates, II-VI semiconductor substrates, etc. Although these substrates have improved device performance, they are fragile and add to manufacturing costs. Thus, the semiconductor industry has begun using compound semiconductor substrates that are a combination of silicon and III-N materials to address the issues of cost, manufacturability, and fragility. A III-N compound semiconductor material formed on a silicon substrate or other semiconductor substrate has been described in U.S. Patent Application Publication Number 2011/0133251 A1 by Zhi He and published on Jun. 9, 2011, and in U.S. Patent Application Publication Number 2013/0069208 A1 by Michael A. Briere and published on Mar. 21, 2013.

Semiconductor manufacturers have used a combination of silicon semiconductor materials and III-N semiconductor materials to manufacture devices, such as a normally-on III-N depletion mode HEMT cascoded with a silicon device. Using this combination of materials helps achieve a normally-off state using a III-N depletion mode device that is normally-on. In cascoded devices configured as switches, the silicon device often operates in avalanche mode due to high leakage currents of the III-N device operating under a high drain bias. In the avalanche operating mode, the gate of the III-N device is under a large stress because the avalanche breakdown voltage of the silicon device may exceed the breakdown voltage of the gate dielectric of the III-N device. Hard stress conditions such as operating the silicon device in the avalanche mode degrades device reliability, lowers the breakdown voltage, and increases leakage currents. Also, operating the silicon device in the avalanche mode might degrade the reliability of the silicon device. Cascoded semiconductor devices have been described in U.S. Patent Application Publication Number 2013/0088280 A1 by Rakesh K. Lai et al. and published on Apr. 11, 2013.

Accordingly, it would be advantageous to have a cascoded semiconductor device structure and a method for manufacturing the cascoded semiconductor device that would decrease the probability of the silicon device from entering avalanche breakdown. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 28 is a cross-sectional view of the semiconductor component of FIG. 26 taken along a region of section line D-D of FIG. 26.

Figure 1:
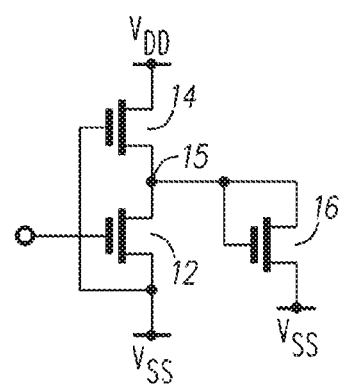
FIG. 1 is a circuit schematic of a semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally, the present invention provides a semiconductor component comprising a semiconductor device configured from a silicon based material, a semiconductor device configured from a III-N semiconductor material, and a protection element. The semiconductor device configured from the silicon based semiconductor material has at least a pair of current carrying terminals and the semiconductor device configured from the III-N semiconductor material has a control terminal and a pair of current carrying terminals. A current carrying terminal of the silicon based semiconductor device is connected to a current carrying terminal of the III-N semiconductor device to form a common connection node and the control terminal of the III-N semiconductor device is connected to the other current carrying terminal of the silicon based semiconductor device. The protection element has a terminal connected to the common connection node and a terminal commonly connected to the other current carrying terminal of the silicon based semiconductor device and to the control terminal of the III-N semiconductor device to form a terminal of the semiconductor component. The other current carrying terminal of the III-N semiconductor device serves as another terminal of the semiconductor component. The protection element may be referred to as a current steering element.

A protection device is coupled to a semiconductor device fabricated from a silicon based material that is coupled to a semiconductor device fabricated from a III-N semiconductor material. Thus, the protection device is coupled to the combination of the silicon semiconductor device and the III-N semiconductor material. The protection device may be a transistor configured such that its threshold voltage is greater than the absolute threshold voltage value of the III-N semiconductor device. In accordance with an embodiment, the threshold voltage of the protection device is adjusted by increasing the concentration of the impurity material in the channel region or body region of the protection device. Under these conditions, the III-N semiconductor device turns off and holds the drain voltage applied to the protection device.

FIG. 1 is a circuit schematic of a III-N semiconductor component 10 in accordance with an embodiment of the present invention. What is shown in FIG. 1 is a semiconductor device 12 coupled to a semiconductor device 14 and configured to form a cascode switch. Thus, III-N semiconductor component 10 may be referred to as a cascode semiconductor component or a cascoded semiconductor component. By way of example, semiconductor devices 12 and 14 are transistors, wherein each transistor has a control terminal, a source terminal, and a drain terminal. In addition, a body region for forming a channel is provided between the source terminal and the drain terminal of transistor 12 and a body region for forming a channel is provided between the source terminal and the drain terminal of transistor 14. Transistor 14 is normally on and may therefore be referred to as a normally-on transistor. The drain terminal of transistor 12 is connected to the source terminal of transistor 14 to form a common connection node 15 and the source terminal of transistor 12 is connected to the gate terminal of transistor 14. As discussed above, the gate terminal of a transistor may be referred to as a gate or gate electrode, the source terminal may be referred to as a source, a source electrode, a current carrying terminal or a current carrying electrode, and the drain terminal may be referred to as a drain, a drain electrode, a current carrying terminal, or a current carrying electrode. In accordance with an embodiment, the source terminal of transistor 12 is coupled for receiving a source of operating potential $V_{SS}$ and the gate terminal of transistor 14 is coupled to the source terminal of transistor 12. By way of example, the source of operating potential $V_{SS}$ is ground.

A protection element such as, for example, a transistor 16 is connected to transistor 12 so that transistor 16 has a terminal connected to common connection node 15, i.e., to the commonly connected drain terminal of transistor 12 and to the source terminal of transistor 14. Transistor 16 has a drain terminal connected to its gate terminal, to form a commonly connected gate and drain terminal that is connected to common node 15. In addition, a body region for forming a channel is between the source terminal and the drain terminal of transistor 16, wherein the concentration of impurity materials in the body region of transistor 16 is greater than the concentration of impurity materials in the body region of at least transistor 12. By way of example, the concentration of impurity materials in the body region of transistor 16 may be between five times and twenty times greater than the concentration of impurity materials in the body region of at least transistor 12. Alternatively, the concentration of impurity materials in the body region of transistor 16 may be at least five times greater than the concentration of impurity materials in the body region of at least transistor 12.

The source terminal of transistor 16 is connected to the source terminal of transistor 12 and to the gate terminal of transistor 14. Because the commonly connected gate and drain terminals of transistor 16 are connected to the drain terminal of transistor 12 and the source terminal of transistor 16 is connected to the source terminal of transistor 12, transistors 12 and 16 are connected in parallel. The source terminals of transistors 12 and 16 may be coupled for receiving a source of operating potential such as, for example, voltage $V_{SS}$. By way of example, source of operating potential $V_{SS}$ is ground potential. In accordance with an embodiment, transistor 16 is configured to have a threshold voltage that is less than the breakdown voltage of transistor 12, but greater than the absolute value of the threshold voltage of transistor 14. It should be noted that transistor 16 is in the leakage current path of the current from III-N transistor 14 and may be sized to handle the leakage current of semiconductor component 10 when semiconductor component 10 is on. Protection element 16 may be referred to as a current steering element, a parallel element, or a leakage path circuit.

In accordance with an embodiment, semiconductor device 12 is manufactured from a silicon based material and semiconductor device 14 is manufactured from a III-N semiconductor material. A silicon based material may include silicon, carbon doped silicon, silicon carbide material, silicon germanium material, etc. A III-N semiconductor material includes gallium nitride, aluminum gallium nitride, etc.

In accordance with another embodiment, the substrate of transistor 14 is coupled to ground, i.e., the III-N semiconductor substrate is grounded.

It should be noted that semiconductor device 12, semiconductor device 14, and protection element 16 may be monolithically integrated or semiconductor device 12 and protection element 16 may be monolithically integrated.

In response to a logic high voltage level at the gate terminal of transistor 12, cascode switch 10 is on and the midpoint voltage is closer to the voltage at the source of transistor 12. It should be noted that the voltage at common connection node 15 may be referred to as the midpoint voltage. In response to a logic low voltage level at the gate terminal of transistor 12, transistor 12 turns off and the midpoint voltage at connection node 15 increases, turning transistor 14 off once it reaches the absolute value of the threshold voltage of transistor 14. If the leakage current flowing through transistor 14 is higher than the leakage current flowing through transistor 12 and protection element 16, the voltage at the drain terminal of transistor 16 continues increasing towards the threshold voltage of transistor 16, which transistor 16 turns on inhibiting a further increase in the mid-point voltage. Thus, the midpoint voltage is less than the breakdown voltage of transistor 12. Preferably, transistor 16 is configured such that its threshold voltage is greater than the absolute threshold voltage value of III-N semiconductor device 14, i.e., transistor 14. Under these conditions, transistor 14 turns off and holds the drain voltage applied to transistor 14.

Figure 2:
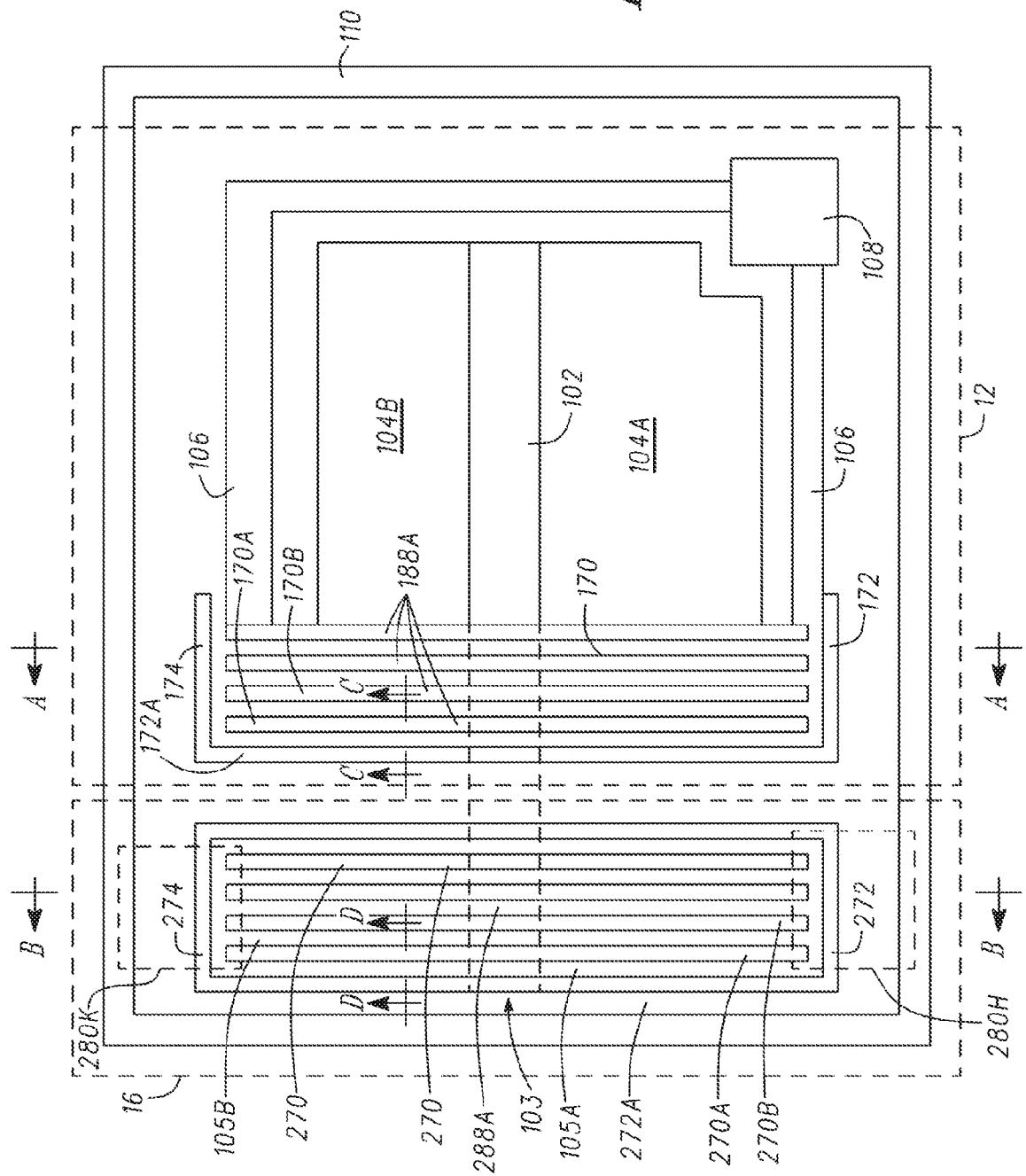
FIG. 2 is a layout of a portion of the semiconductor component of FIG. 1 in accordance with another embodiment of the present invention.
Figure 14:
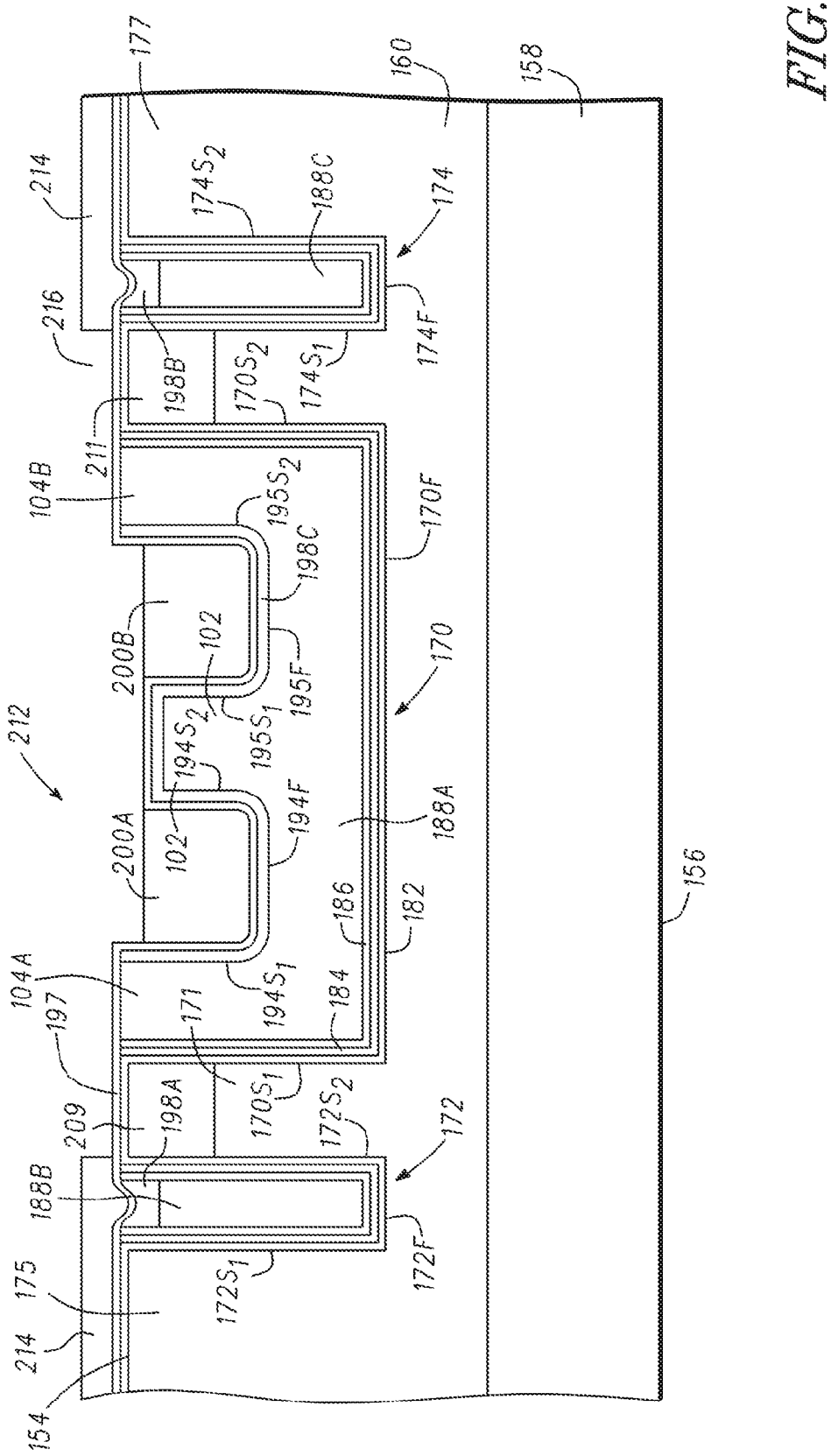
FIG. 14 is a cross-sectional view of the semiconductor component of FIG. 12 at a later stage of manufacture.
Figure 14A:
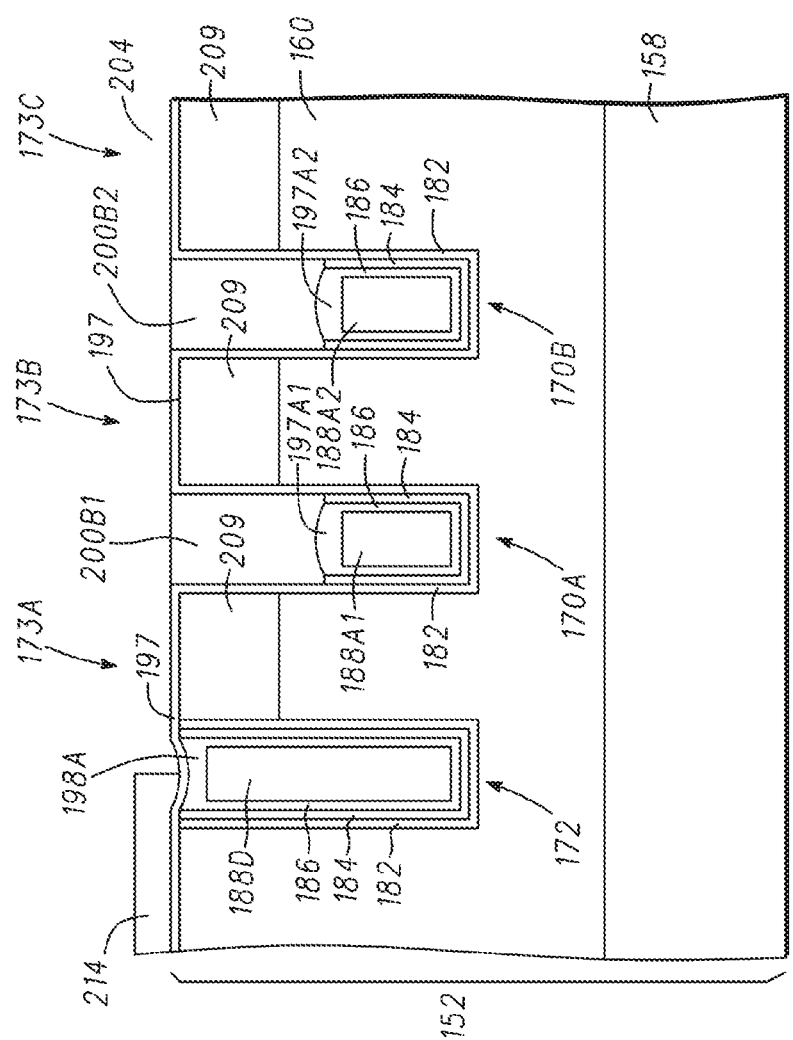
FIG. 14A is a cross-sectional view of the semiconductor component of FIG. 12A at a later stage of manufacture.
Figure 15:
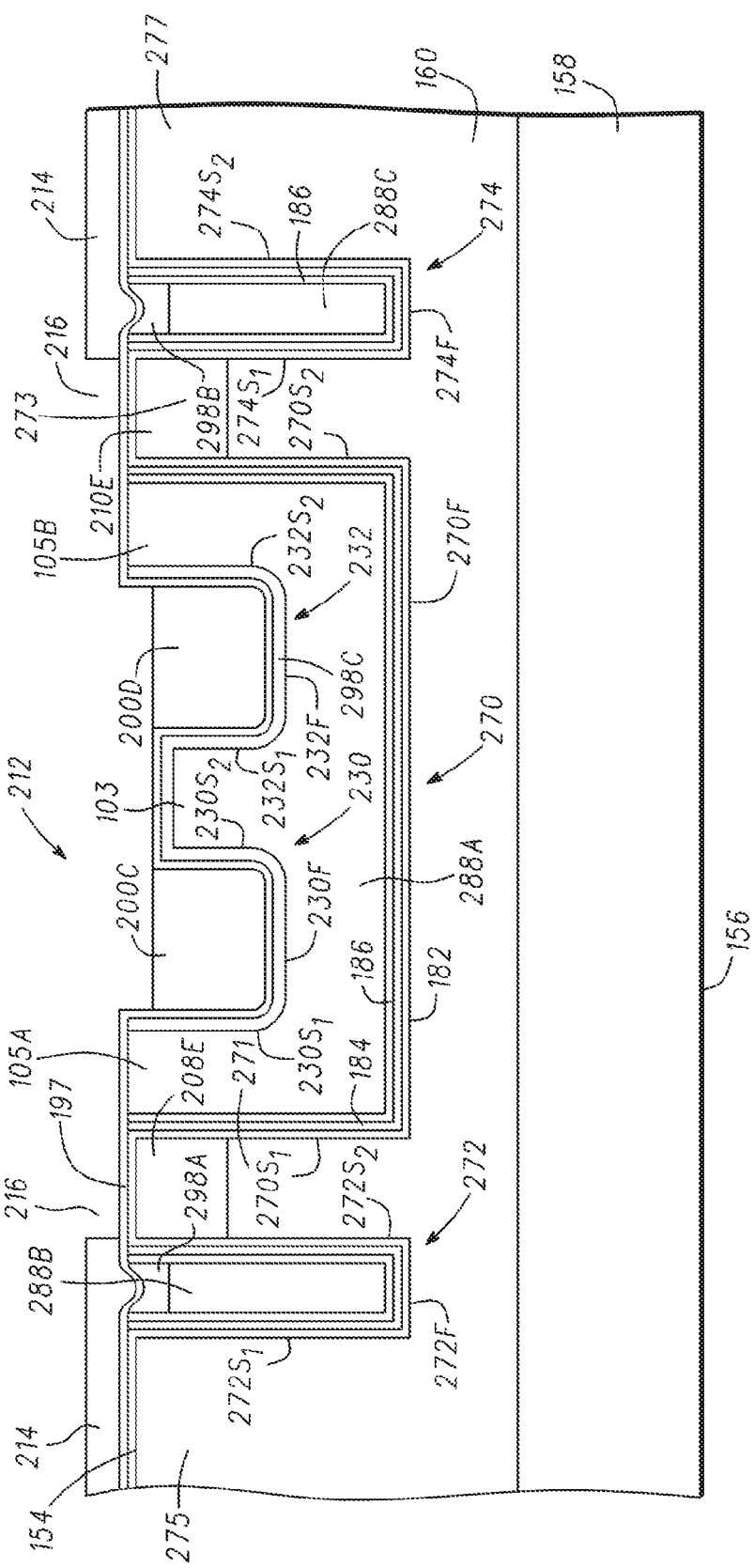
FIG. 15 is a cross-sectional view of the semiconductor component of FIG. 13 at a later stage of manufacture.
Figure 15A:
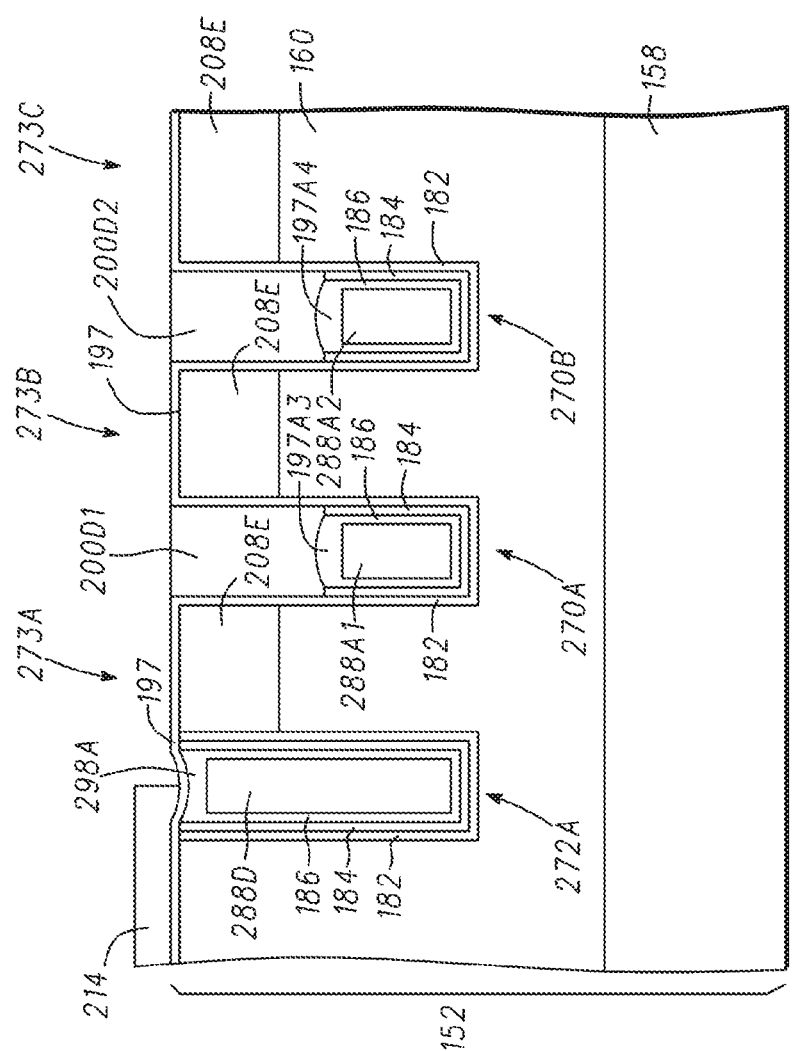
FIG. 15A is a cross-sectional view of the semiconductor component of FIG. 13 at a later stage of manufacture.

FIG. 2 is a top view of a semiconductor component 100 in accordance with another embodiment of the present invention. The top view shown in FIG. 2 may be referred to as a layout. What is shown in FIG. 2 is a layout of a transistor such as, for example, transistor 12 which is configured for use in a cascode device and transistor 16 which is configured for use as a clamping device. Cascode device 12 includes a shield region 102 formed between source regions 104A and 104B, a gate feed 106 adjacent source regions 104A and 104B, a gate pad 108, and a drain ring 110 surrounding shield region 102, source regions 104A and 104B, gate feed 106, and gate pad 108. Drain ring 110 can be referred to as a drain contact structure. In addition, cascode device 12 includes an active trenches 170 and termination trenches 172, 172A, and 174. Shield region 102, source regions 104A and 104B, drain ring 110, active trench 170, and termination trenches 172, 172A, and 174 are described with reference to FIGS. 12, 14, 16, 18, 20, 22, and 24. It should be noted that: the active trenches for semiconductor device 14 are collectively identified by reference character 170 and for the sake of the clarity trenches 170A and 170B have been identified and further shown in FIGS. 12A and 14A; the active trenches for semiconductor device 16 are identified by reference character 270 and for the sake of clarity trenches 270A and 270B have been identified and further shown in FIGS. 13A and 15A; the termination trench for semiconductor device 12 is identified by portions 172, 172A, and 174, where each portion is identified as a termination trench for the sake of clarity; and the termination trench for semiconductor device 16 is identified by portions 272, 272A, and 274, where each portion is identified as a termination trench for the sake of clarity.

Clamping device 16 includes a shield region 103 formed between source regions 105A and 105B, and drain ring 110 surrounding shield region 103 and source regions 105A and 105B. In addition, clamping device 16 includes an active trench 270 and termination trenches 272 and 274. Shield region 103, source regions 105A and 105B, drain ring 110, active trench 270, and termination trenches 272 and 274 are described with reference to FIGS. 13, 15, 17, 19, 21, 23, and 25. FIG. 2 further illustrates interconnects 280H and 280K that electrically connect the gate electrodes of transistor 16 to drain ring 110. Interconnects 280H and 280K are further described with reference to FIG. 25.

Figure 3:
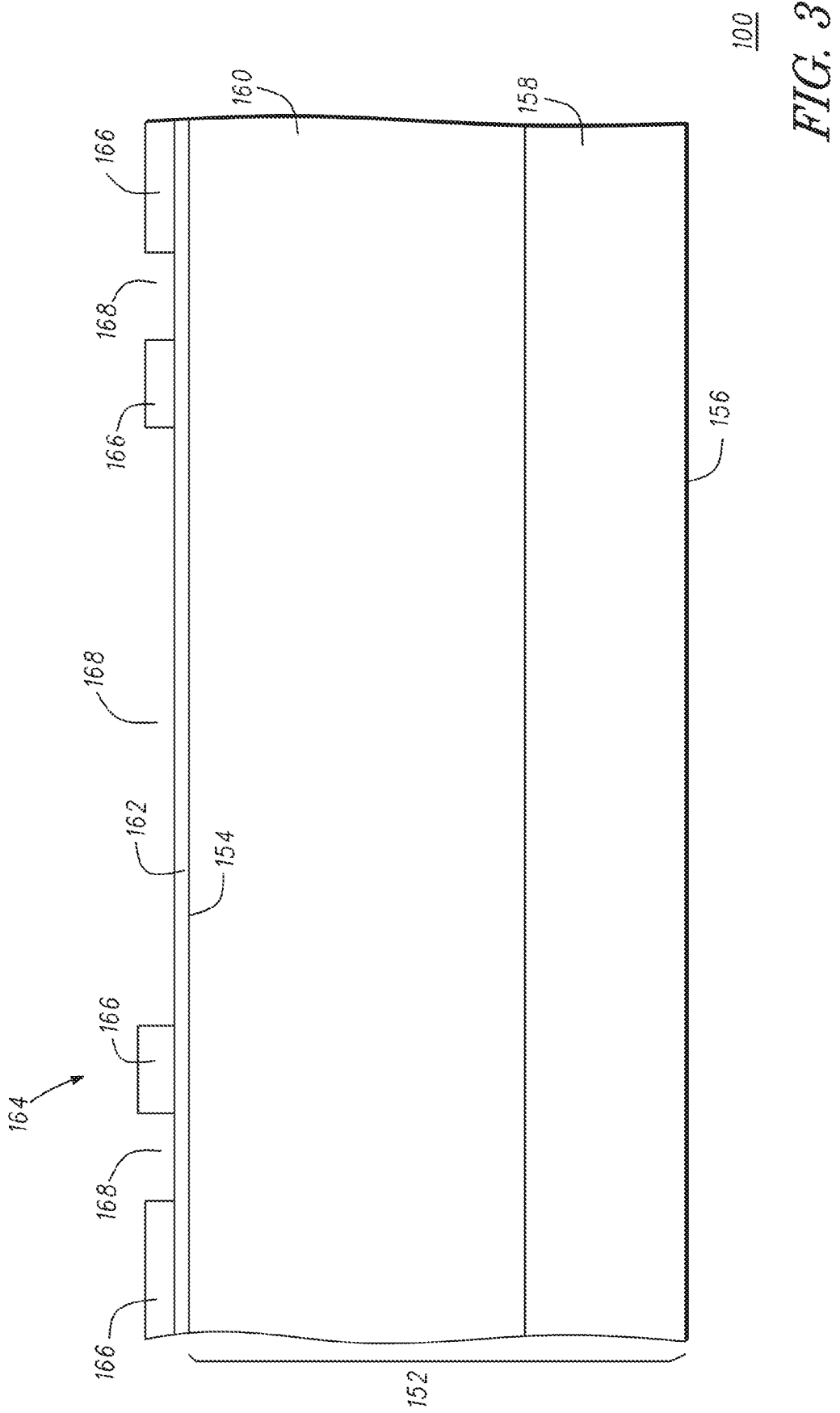
FIG. 3 is a cross-sectional view of the semiconductor component of FIG. 2 taken along a region of section line A-A of FIG. 2 but at an earlier stage of manufacture.

FIG. 3 is a cross-sectional view taken along the region of section line A-A of FIG. 2 but at an earlier stage of manufacture than that shown in FIG. 2. It should be noted that at the stage of manufacture represented by FIG. 3, the region indicated by section line B-B of FIG. 2 has the same structure as the region indicated by section line A-A of FIG. 1. It should be further noted that FIGS. 3-11 describe the portions of semiconductor component 10 taken along section line A-A of FIG. 2 and that the cross-sectional views of FIGS. 3-11 are representative of the structure of clamping device 16 taken along section line B-B shown in FIG. 2 at the stages represented by FIGS. 3-11. Thus, the structures of FIGS. 3-11 look the same for cascode device 12 and clamping device 16. For example, trenches 170, 172, and 174 of FIGS. 3-11 correspond to trenches 270, 272, and 274, respectively, of semiconductor device 16. It should be noted that FIGS. 12, 14, 16, 18, 20, 22, and 24 represent cascode device 12 after the stages of manufacture illustrated by FIGS. 3-11 and that FIGS. 13, 15, 17, 19, 21, 23, and 25 represent clamping device 16 after the stages of manufacture illustrated by FIGS. 3-11.

FIG. 3 is cross-sectional view illustrating a semiconductor material 152 having opposing surfaces 154 and 156. Surface 154 is also referred to as a front or top surface and surface 156 is also referred to as a bottom or back surface. In accordance with this embodiment, semiconductor material 152 comprises a semiconductor substrate 158 doped with an impurity material of N-type conductivity and having a resistivity ranging from about 0.0005 Ohm-centimeter (Ω-cm) to about 0.02 Ω-cm. By way of example, the material for substrate 158 is silicon.

In accordance with an embodiment, semiconductor material 152 further comprises an epitaxial layer 160 formed on substrate 158 where epitaxial layer 160 is of N-type conductivity and has a resistivity that may range from about 0.03 Ω-cm to about 1 Ω-cm. A buried layer (not shown) may be formed in a portion of epitaxial layer 160 and substrate 158.

Semiconductor layer 160 may be formed using semiconductor epitaxial growth techniques, semiconductor doping and diffusion techniques, or the like. By way of example, semiconductor layer 160 is formed by an epitaxial growth technique having a thickness ranging from about 2 micrometers (μm) to about 10 μm and a dopant concentration ranging from about $5.0 \times 10^{15}$ atoms/cm$^3$ to about $1.0 \times 10^{17}$ atoms/cm$^3$. As those skilled in the art are aware, a micrometer may be referred to as a micron. The dopant concentration and thickness of semiconductor layer 160 can be increased or decreased depending on the desired drain-to-source breakdown voltage rating (BVDSS) of semiconductor component 100. Alternatively, the conductivity type of substrate 158 can be opposite to the conductivity type of semiconductor layer 160 to form, for example, an insulated gate bipolar transistor (IGBT). Other semiconductor devices that can be manufactured using semiconductor material 152 include a vertical power MOSFET, MOS-gated thyristors, and other equivalent structures known to one of ordinary skill in the relevant art.

It should be noted that a region or layer doped with an N-type dopant or impurity material is said to be of an N-type conductivity or an N conductivity type and a region or layer doped with a P-type dopant or impurity material is said to be of a P-type conductivity or a P conductivity type.

A masking layer 162 can be formed on or from semiconductor material 152. Masking layer 162 can be a dielectric film or a film resistant to the etch chemistries used to form trenches or trench features. By way of example, masking layer 162 is a thermally grown oxide having a thickness ranging from about 0.1 μm to about 1.0 μm. Alternatively, masking layer 162 can be a TEOS layer formed using plasma enhanced chemical vapor deposition. Still referring to FIG. 3, a layer of photoresist is patterned over dielectric layer 162 to form a masking structure 164 having masking elements 166 and openings 168 that expose portions of dielectric layer 162.

Figure 4:
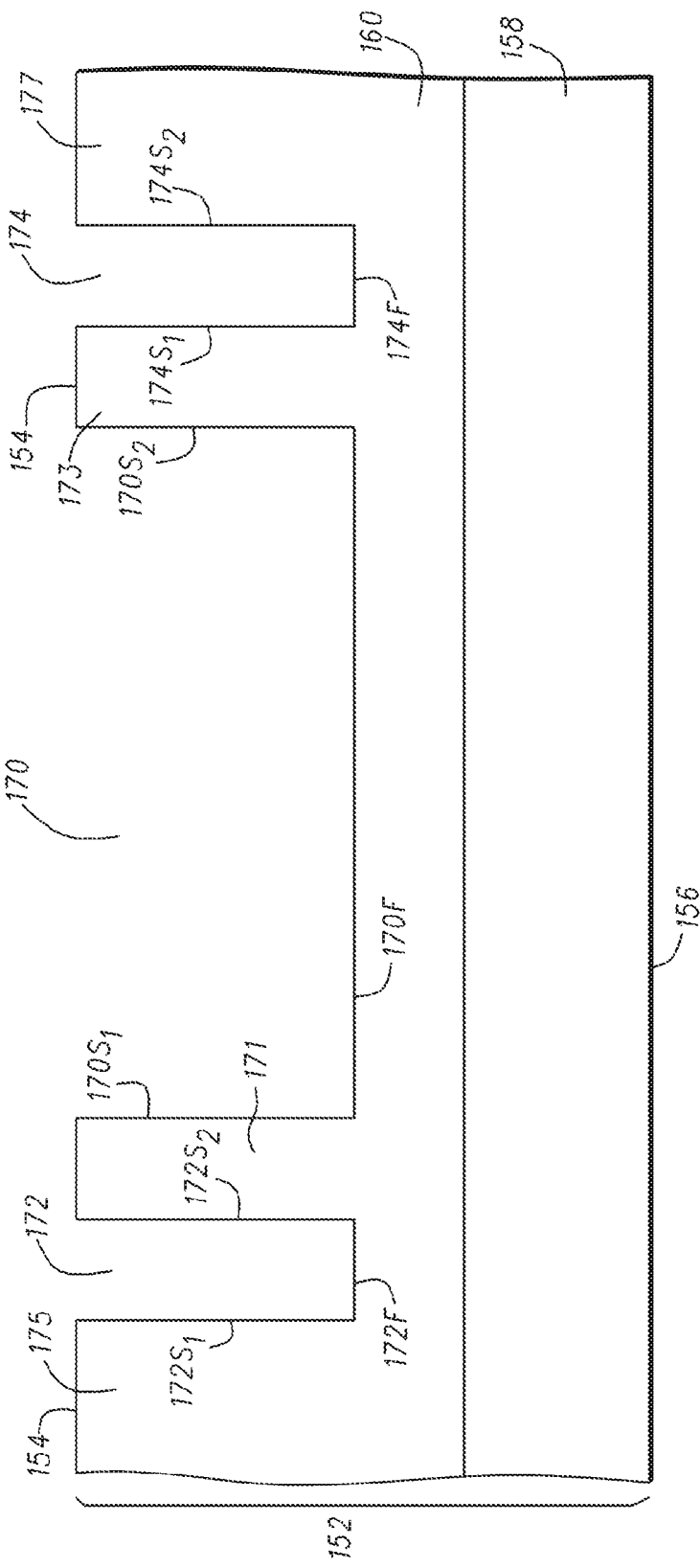
FIG. 4 is a cross-sectional view of the semiconductor component of FIG. 3 at a later stage of manufacture.

Referring now to FIG. 4, a cross-sectional view of the manufacture of semiconductor component 100 at a later stage of manufacture than that of FIG. 3 is illustrated. What is shown in FIG. 4 is the formation of trenches 170, 172, and 174 that extend from portions of surface 154 into epitaxial layer 160. By way of example, trenches 170, 172, and 174 are formed by etching epitaxial layer 160 using, for example, plasma etching techniques with a fluorocarbon or fluorine-based etch chemistry (for example, $SF_6/O_2$). In accordance with an embodiment, trenches 170, 172, and 174 extend into epitaxial layer 160 but do not extend as far as substrate 158 and in accordance with another embodiment trenches 170, 172, and 174 extend through epitaxial layer 160 and into substrate 158. By way of example, trenches 170, 172, and 174 have a depth ranging from about 1 μm to about 5 μm and are formed using a single etch step. Alternatively, trenches 170, 172, and 174 can be formed using a multi-step etch process. Techniques for forming trenches 170, 172, and 174 are not limitations of the present invention. Trench 170 has sidewalls $170S_1$ and $170S_2$, and a floor 170F; trench 172 has sidewalls $172S_1$ and $172S_2$, and a floor 172F; and trench 174 has sidewalls $174S_1$ and $174S_2$, and a floor 174F.

It should be noted that the portion of epitaxial layer 160 between trenches 170 and 172 may be referred to as a mesa structure 171, the portion of epitaxial layer 160 between trenches 170 and 174 may be referred to as a mesa structure 173, the portion of epitaxial layer 160 adjacent side $172S_1$ of trench 172 may be referred to as a mesa structure 175, and the portion of epitaxial layer 160 adjacent side $174S_2$ of trench 174 may be referred to as a mesa structure 177. Trench 170 may be referred to as an active trench and trenches 172 and 174 may be referred to as termination trenches. As discussed with reference to FIG. 2, trenches 172 and 174 may be formed as a single trench wherein trenches 172 and 174 are connected by trench 172A.

Figure 5:
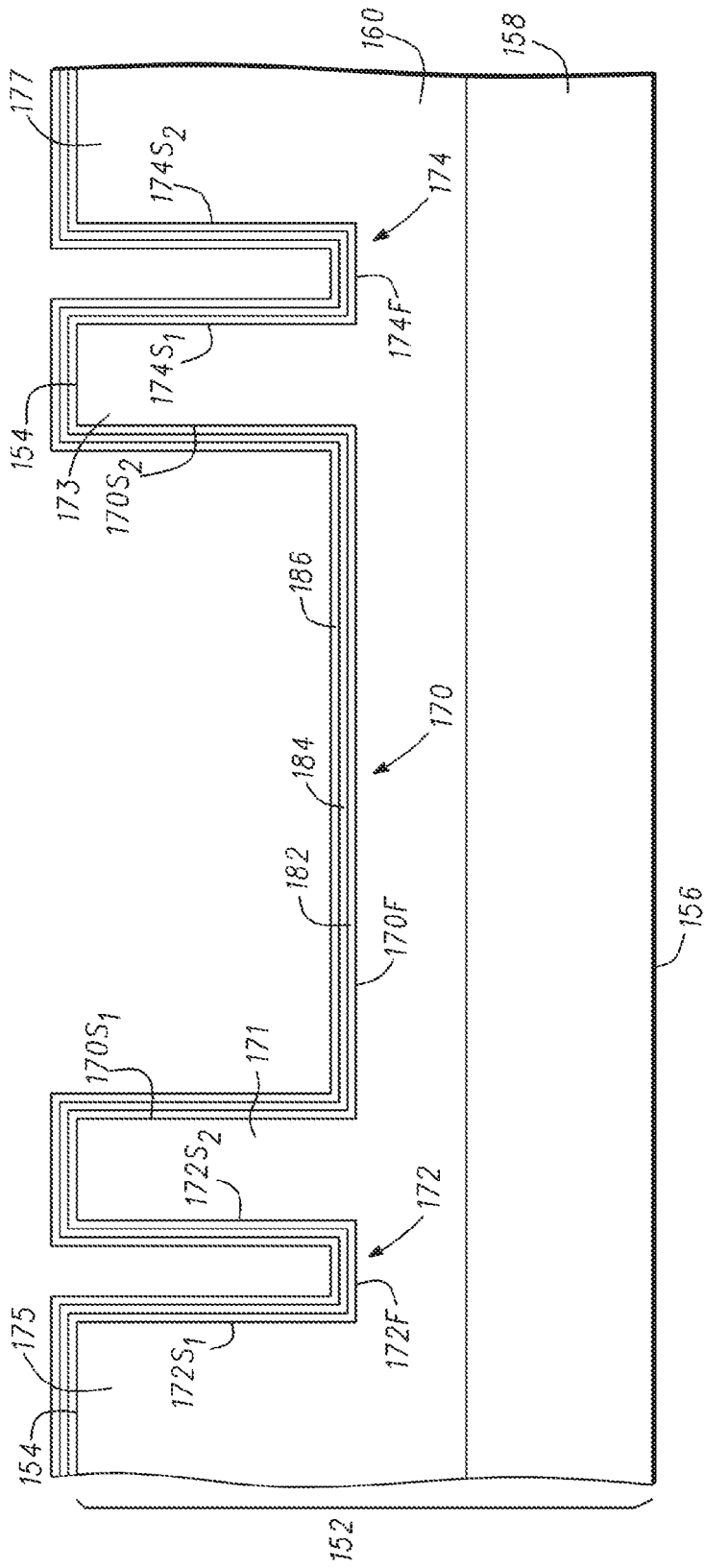
FIG. 5 is a cross-sectional view of the semiconductor component of FIG. 4 at a later stage of manufacture.

Referring now to FIG. 5, a cross-sectional view of the manufacture of semiconductor component 100 at a later stage of manufacture than that of FIG. 4 is illustrated. What is shown in FIG. 5 is a layer of material 182 formed on the sidewalls, ends, and floors of trenches 170, 172, and 174 and on surface 154 of semiconductor material 152. The portions of layer 182 over mesa structures 171 and 173 serve as a gate layer or a gate dielectric film. Suitable materials for gate layer 182 include silicon dioxide, nitride, tantalum pentoxide, titanium dioxide, barium strontium titanate, high k dielectric materials, combinations thereof or equivalent materials known to one of ordinary skill in the art. By way of example, gate layer 182 is silicon dioxide having a thickness ranging from about 0.01 μm to about 0.05 μm. In accordance with an embodiment, gate layer 182 is formed at an early stage of the process which helps maintain the integrity of the interface between gate layer 182 and semiconductor layer 160 and also provides a more uniform film thickness for gate layer 182.

Still referring to FIG. 5, a layer of material 184 can be formed adjacent to or on gate layer 182. Layer 184 can comprise a material that is different from that of gate layer 182. In accordance with an embodiment layer 184 is silicon nitride when gate layer 182 is silicon dioxide. By way of example, layer 184 is formed using a low pressure chemical vapor deposition (LPCVD) technique and has a thickness ranging from about 0.01 μm to about 0.05 μm.

A layer of dielectric material 186 is formed adjacent to or on layer 184. In accordance with an embodiment, dielectric layer 186 is an oxide or oxide layer formed using an LPCVD technique with a tetraethyl-orthosilicate (TEOS) source material. Alternatively, dielectric layer 186 can be formed using LPCVD with a high temperature oxide (HTO) process (LPCVD/HTO), which can form a more dense deposited oxide compared to LPCVD oxides formed using TEOS source materials. By way of example, a silane source material can be used with an oxidizing reactant, such as nitrous oxide ($N_2O$) for the LPCVD/HTO process. In accordance with an example, dielectric layer 86 has a thickness ranging from about 0.04 μm to about 0.25 μm. It should be noted that the breakdown voltage for semiconductor component 100 can be adjusted by selecting the thickness of layer 186. For example, semiconductor component 100 may be manufactured to have a breakdown voltage BVDSS of about 60 volts by fabricating dielectric layer 186 to have a thickness ranging from about 0.2 μm to about 0.25 μm.

Figure 6:
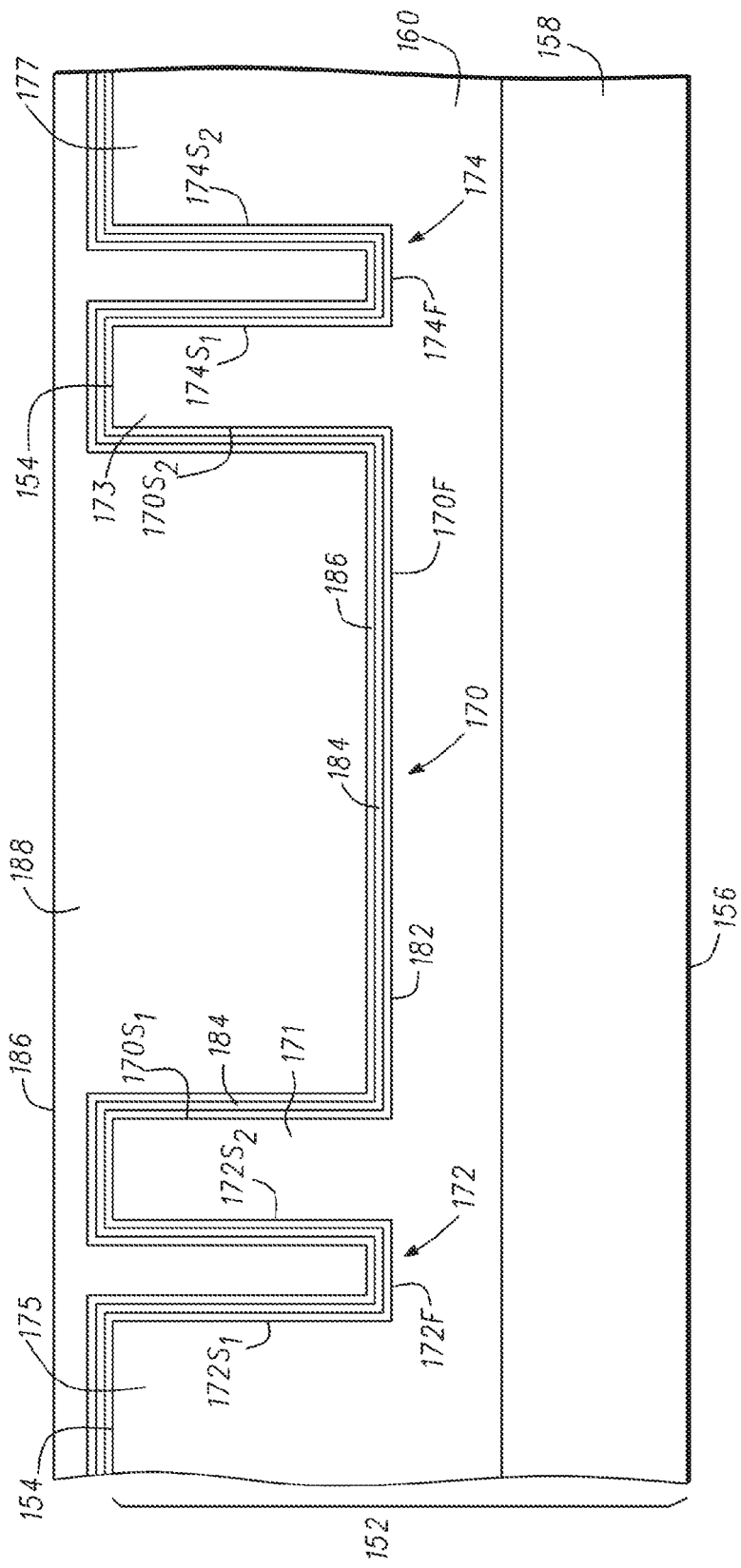
FIG. 6 is a cross-sectional view of the semiconductor component of FIG. 5 at a later stage of manufacture.

Referring now to FIG. 6, a layer of electrically conductive material 188 is formed on dielectric layer 86 and in trenches 170, 172, and 174. Electrically conductive layer 186 can be a metal or a doped crystalline semiconductor layer. By way of example, electrically conductive layer 188 is polysilicon doped with an N-type dopant such as, for example, phosphorus or arsenic. After doping, the polysilicon may be annealed in an inert ambient or oxidizing agent.

Figure 7:
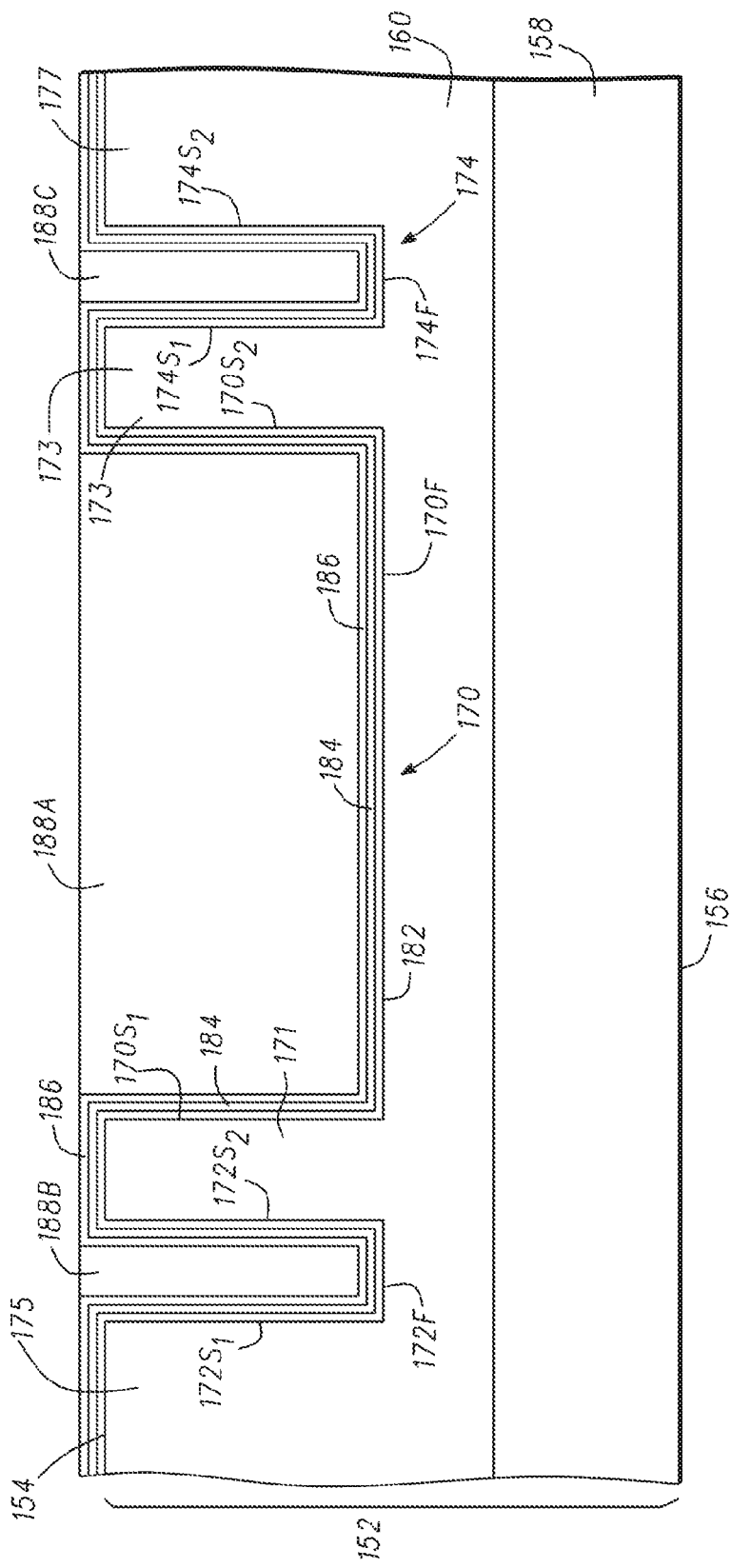
FIG. 7 is a cross-sectional view of the semiconductor component of FIG. 6 at a later stage of manufacture.

Referring now to FIG. 7, conductive layer 188 is planarized using, for example, a chemical mechanical planarization (CMP) technique leaving portions 188A, 188B, and 188C in trenches 170, 172, and 174, respectively. Portion 188A serves as a shield/source electrode or shield/source region and portions 188B and 188C serve as termination regions or termination structures.

Figure 8:
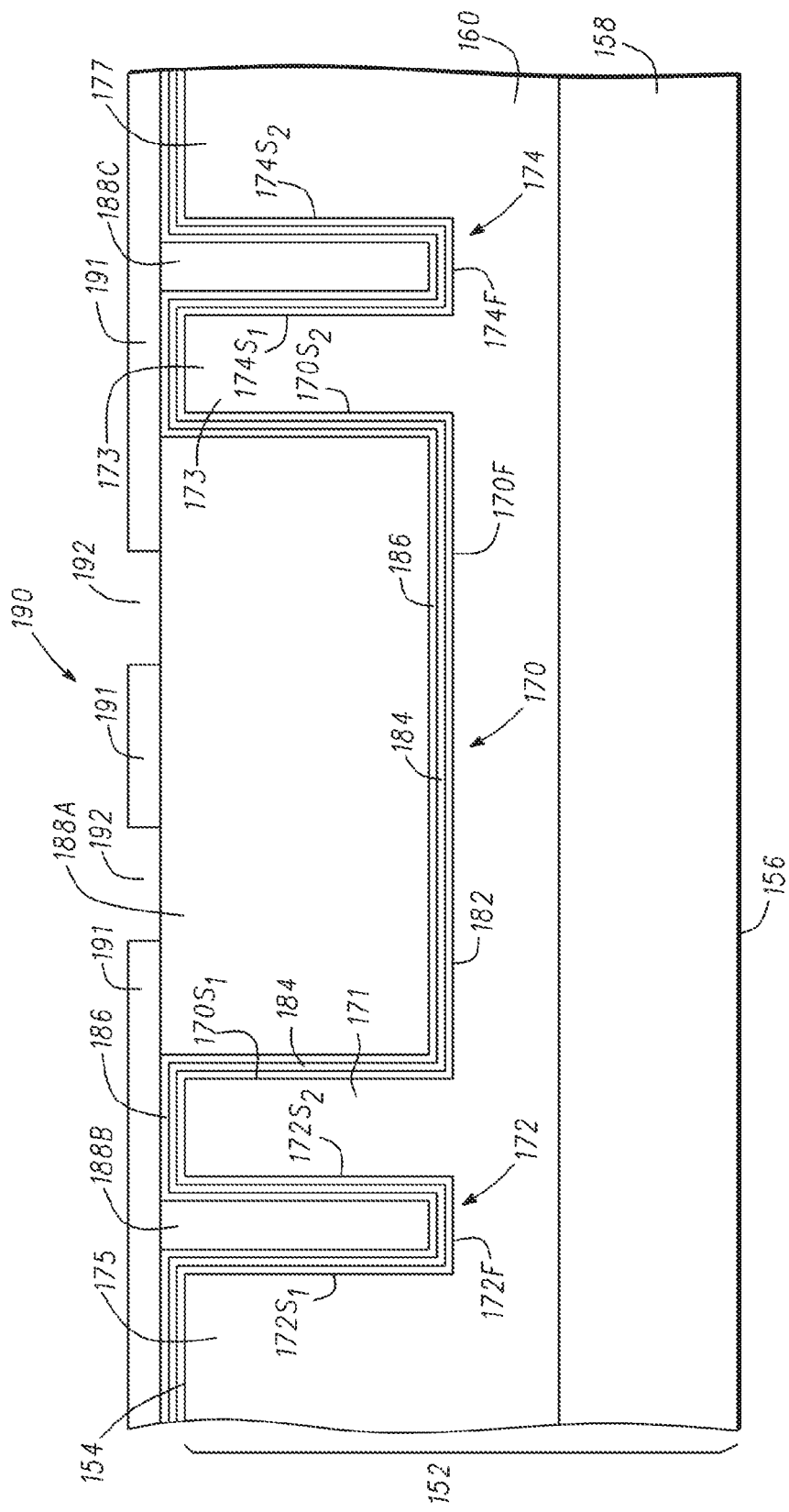
FIG. 8 is a cross-sectional view of the semiconductor component of FIG. 7 at a later stage of manufacture.

Referring now to FIG. 8, a layer of photoresist is patterned over dielectric layer 186 and the exposed portions of electrically conductive portions 188A, 188B, and 188C in trenches 170, 172, and 174, respectively, to form a masking structure 190 having masking elements 191 and openings 192 that expose portions of shield/source region 188A.

Figure 9:
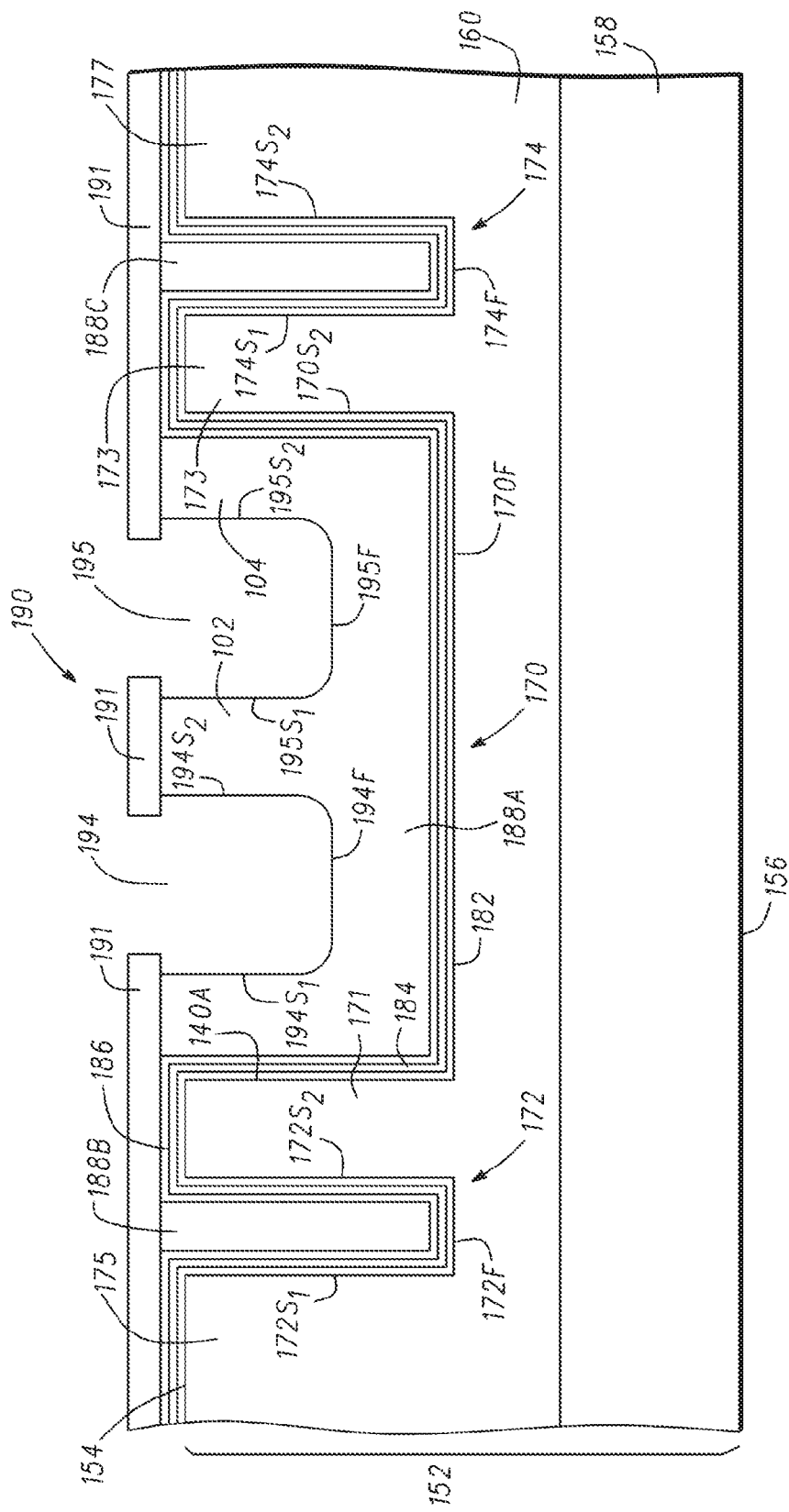
FIG. 9 is a cross-sectional view of the semiconductor component of FIG. 8 at a later stage of manufacture.

Referring now to FIG. 9, the portions of shield/source region 188A exposed by openings 192 are isotropically etched to form a trench 194 having a floor 194F, a sidewall 194S$_1$, and a sidewall 194S$_2$ and a trench 195 having a floor 195F, a sidewall 195S$_1$, and a sidewall 195S$_2$. The sub-portion of conductive portion 188A between sidewall 170S$_1$ of trench 170 and sidewall 194S$_1$ of trench 194 is identified by reference character 104A, the sub-portion of conductive portion 188A between sidewall 194S$_2$ of trench 194 and sidewall 195S$_1$ of trench 195 is identified by reference character 102, and the sub-portion of conductive portion 188A between sidewall 170S$_2$ of trench 170 and sidewall 174S$_1$ of trench 174 is identified by reference character 104B.

Figure 10:
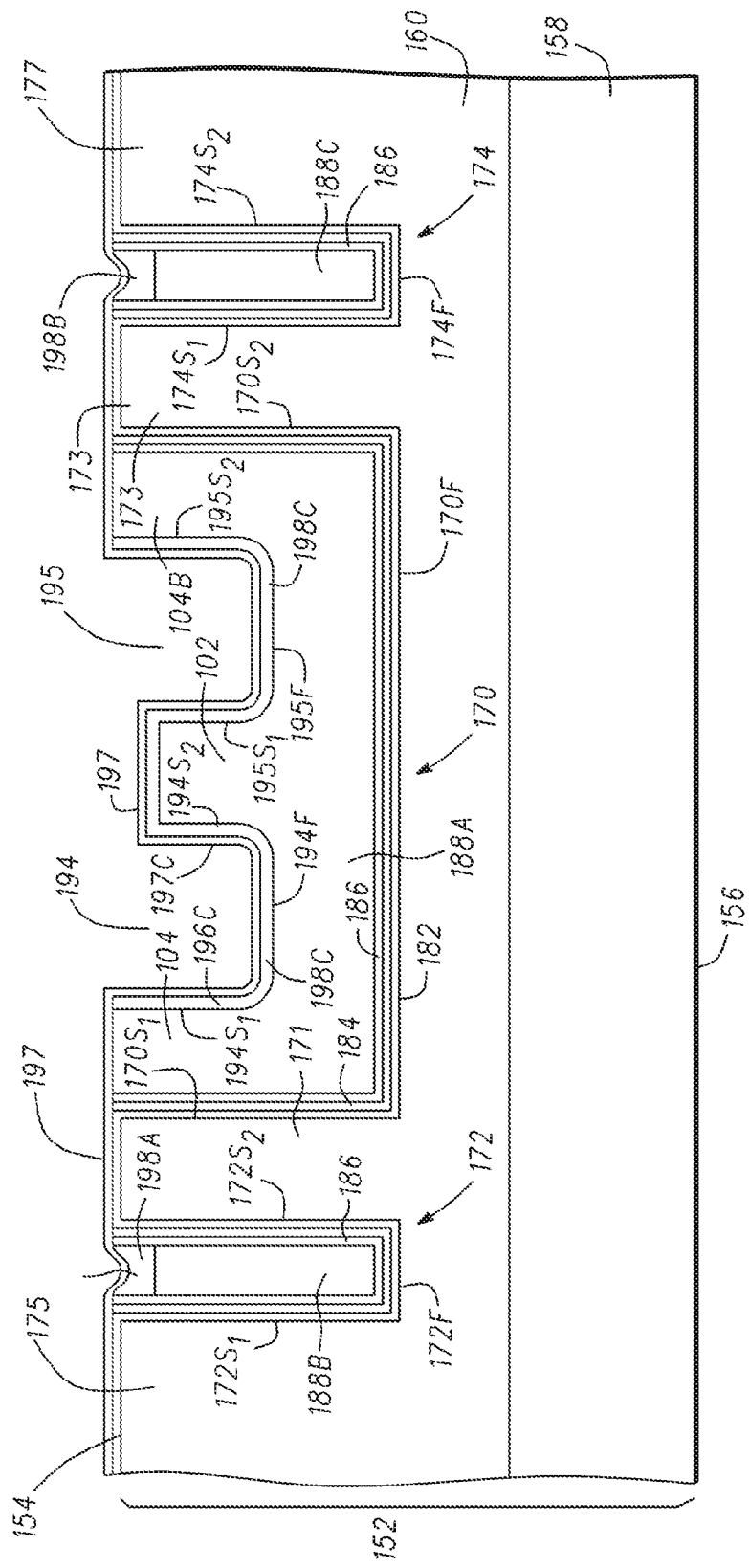
FIG. 10 is a cross-sectional view of the semiconductor component of FIG. 9 at a later stage of manufacture.

Referring now to FIG. 10, masking structure 190 is removed using a technique known to those skilled in the art. Shield/source region 188A and termination regions 188B and 188C are recessed to be below surface 154 of semiconductor material 152. By way of example, shield/source region 188A and termination regions 188B and 188C are recessed using an etch technique. The exposed portions of layer of dielectric material 186 over dielectric layer 184 and surface 154 are removed using, for example, a Reactive Ion Etch. The exposed portions of source/shield region 188A and termination regions 188B and 188C are oxidized to form inter-poly oxide layers 198A and 198B from the exposed polysilicon portions of termination regions 188B and 188C, respectively, and to form an inter-poly oxide layer 198C from the portions of shield/source region 188A exposed by trenches 194 and 195, respectively. Optionally, an oxide layer (not shown) may be formed over inter-poly oxide layers 198A-198C to fill any "fangs" or recesses that may be formed around inter-poly oxide layers 198A-198C. The optional oxide layer is then etched using, for example, an etch technique to expose portions of dielectric layer 184 over surface 154 and portions of dielectric layer 184 adjacent sidewalls 194S$_1$ and 195S$_2$.

Still referring to FIG. 10, the portions of dielectric layer 184 over surface 154, are removed using, for example, a Reactive Ion Etch. A thin high temperature oxide 197 is formed on the exposed portions of dielectric layer 182 and oxide layer 198C. Oxide layer 197 may be referred to as a layer of dielectric and the combination of oxide layer 197 and oxide layer 198C may be referred to as a composite gate oxide.

Figure 11:
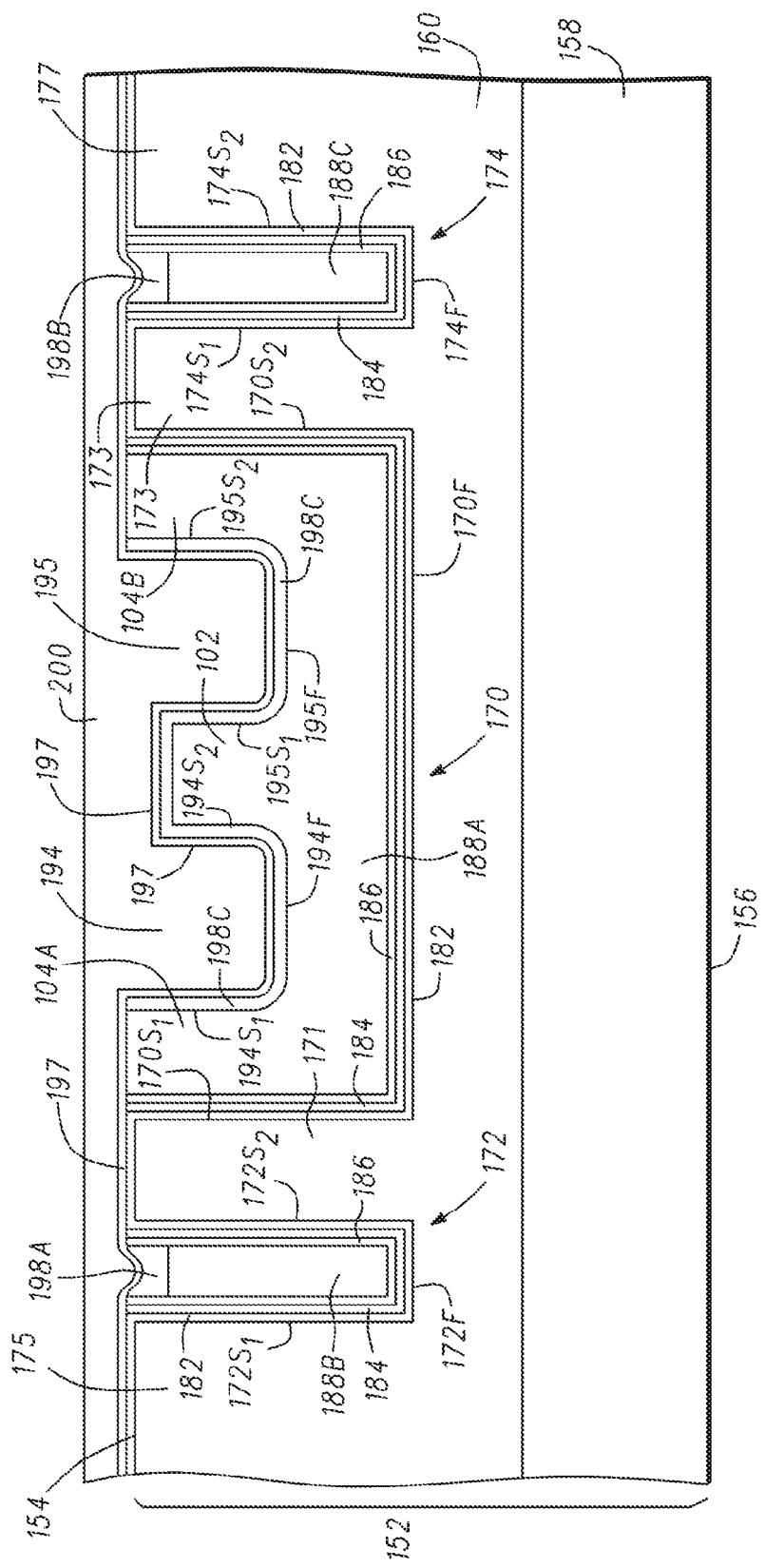
FIG. 11 is a cross-sectional view of the semiconductor component of FIG. 10 at a later stage of manufacture.

Referring now to FIG. 11, a layer of electrically conductive material 200 is formed on dielectric layer 197 in trenches 194 and 195, respectively. Electrically conductive layer 200 can be a metal or a doped crystalline semiconductor layer. By way of example, electrically conductive layer 200 is polysilicon doped with an N-type dopant such as, for example, phosphorus or arsenic. After doping, the polysilicon may be annealed in an inert ambient or an oxidizing agent.

Figure 12:
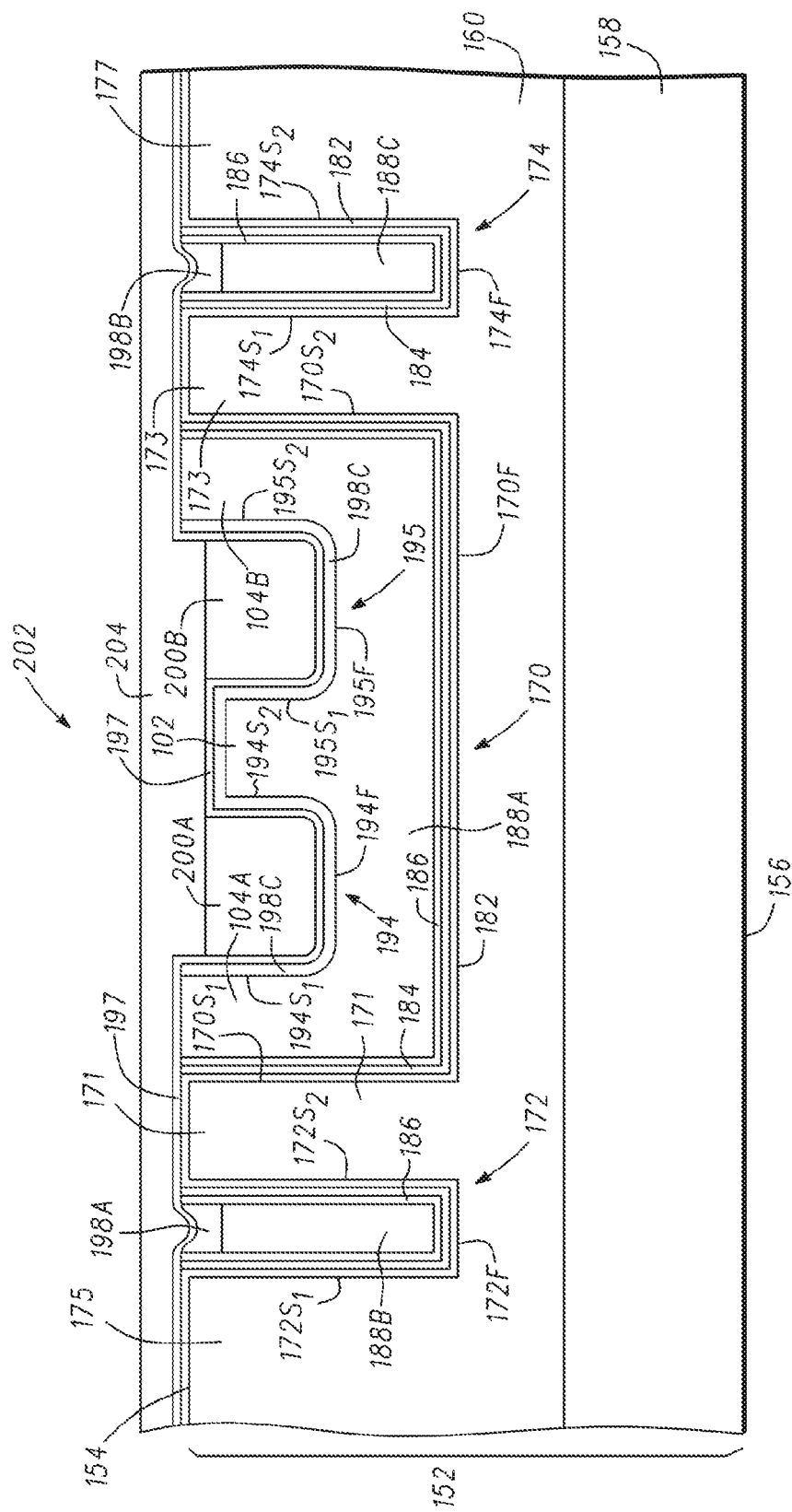
FIG. 12 is a cross-sectional view of the semiconductor component of FIG. 11 at a later stage of manufacture.
Figure 12A:
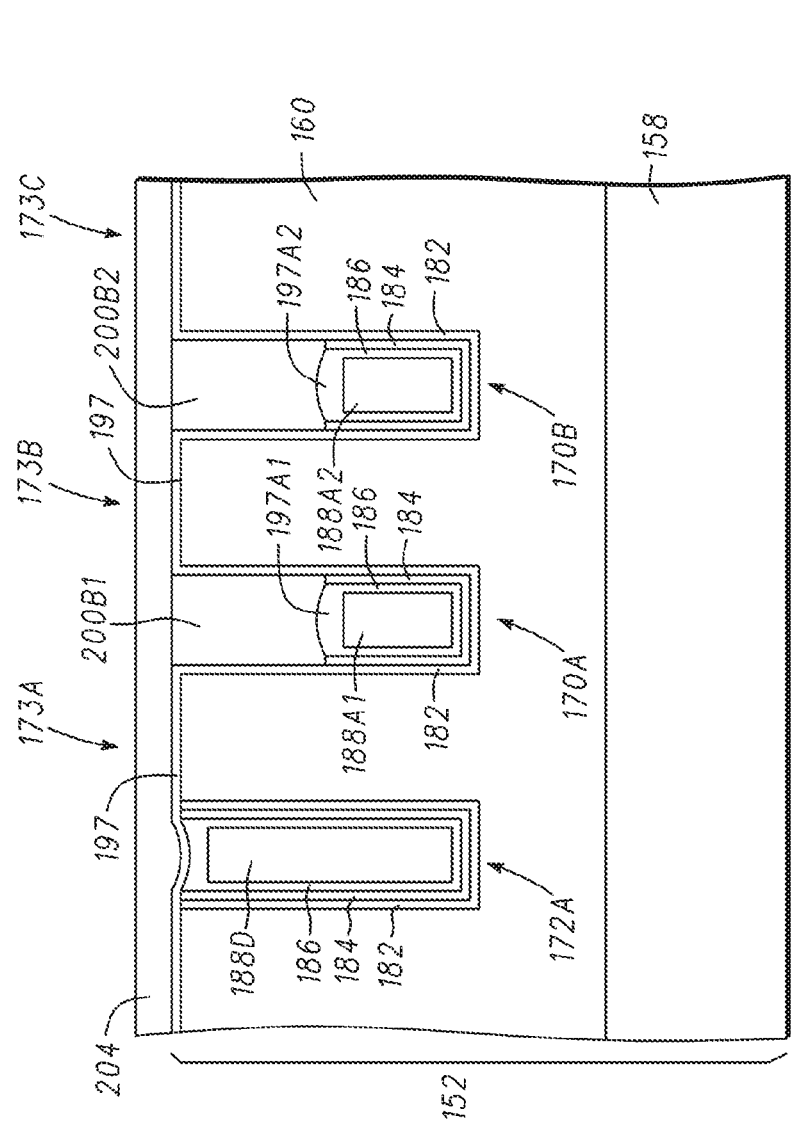
FIG. 12A is a cross-sectional view of the semiconductor component of FIG. 2 taken along section line C-C of FIG. 2, but at an earlier stage of manufacture.
Figure 13:
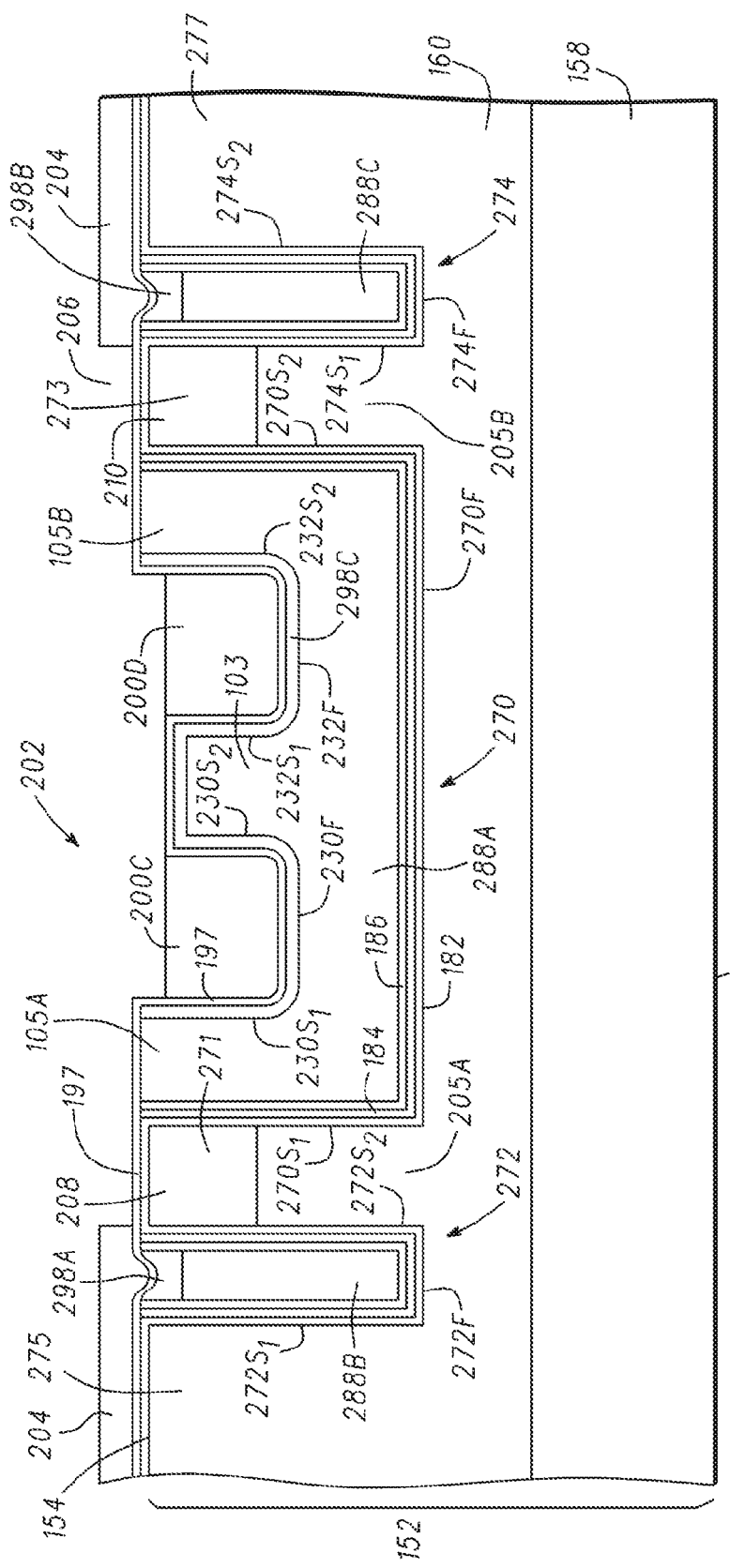
FIG. 13 is a cross-sectional view of the semiconductor component of FIG. 2 taken along a region of section line B-B of FIG. 2 but at an earlier stage of manufacture.

Referring now to FIGS. 12, 12A, and 13, electrically conductive layer 200 is planarized using for example, a chemical mechanical planarization (CMP) technique leaving portions 200A and 200B in trenches 194 and 195, respectively, and portions 200C and 200D in trenches 230 and 232, respectively. It should be noted that the cross-sectional view of FIG. 12 is taken along section line A-A of FIG. 2, the cross-sectional view of FIG. 12A is taken along section line C-C of FIG. 2, and the cross-sectional view of FIG. 13 is taken along section line B-B of FIG. 2, but at an earlier stage of manufacture. It should be further noted that FIGS. 12 and 12A represent cross-sectional views of a semiconductor device such as transistor 12 of cascode configured device 10 of FIG. 1, that FIG. 13 represents a cross-sectional view of a semiconductor device such as clamping device 16 of cascode configured device 10 of FIG. 1, and that FIGS. 12, 12A, and 13 occur at the same time in the process.

In accordance with an embodiment in which semiconductor device 12 and semiconductor device 16 are monolithically integrated from a common semiconductor material, the processing steps for manufacturing the semiconductor devices are the same. As discussed with reference to FIG. 2, the structures of FIGS. 3-11 look the same for cascode device 12 and clamping device 16; FIGS. 12, 12A, 14, 14A, 16, 18, 20, 22, and 24 represent cascode device 12 after the stages illustrated by FIGS. 3-11; and FIGS. 13, 13A, 15, 15A, 17, 19, 21, 23, and 25 represent clamping device 16 after the stages illustrated by FIGS. 3-11. It should be appreciated that the termination trenches of semiconductor device 12 have been identified by reference characters 172 and 174 and that the device trenches of semiconductor device 12 have been identified by reference character 170, whereas the termination trenches of semiconductor device 16 have been identified by reference characters 272 and 274, the device trenches of semiconductor device 16 have been identified by reference character 270, the gate trenches of device 12 have been identified by reference characters 194 and 195, and the gate trenches of device 16 have been identified by reference characters 230 and 232. Likewise the portion of semiconductor material 188 that remains in trenches 170, 172, and 174 of semiconductor device 12 have been identified by reference characters 188A, 188B, and 188C, respectively; the portion of electrically conductive material 188 that remains in trenches 270, 272, and 274 of semiconductor device 16 have been identified by reference characters 288A, 288B, and 288C, respectively; the portions of electrically conductive material 200 that remain in trenches 194 and 195 have been identified by reference characters 200A and 200B, respectively; and the portion of electrically conductive material 200 that remains in trenches 230 and 232 has been identified by reference characters 200C and 200D, respectively. Mesa structures of semiconductor device 12 have been identified by reference characters 171, 173, 175, and 177 and mesa structures of semiconductor device 16 have been identified by reference characters 271, 273, 275, and 277.

In addition, the subportion of electrically conductive material 188A that serves as source/shield region 104A in FIG. 2 is identified by reference character 104A in FIG. 12; the subportion of electrically conductive material 188A that serves as source/shield region 104B in FIG. 2 is identified by reference character 104B in FIG. 12; the subportion of electrically conductive material 188A that serves as shield region 102 in FIG. 2 is identified by reference character 102 in FIG. 12; the subportion of electrically conductive material 288A that serves as source/shield region 105A in FIG. 2 is identified by reference character 105A in FIG. 13; the subportion of electrically conductive material 288A that serves as source/shield region 105B in FIG. 2 is identified by reference character 105B in FIG. 13; and the subportion of electrically conductive material 288A that serves as shield region 103 in FIG. 2 is identified by reference character 103 in FIG. 13.

It should be noted that the processing steps described with reference to FIG. 10 occurs for semiconductor devices 12 and 16, where the reference characters used in the description of FIG. 10 apply to semiconductor device 12. For the sake of completeness, the processing steps for semiconductor device 16 in recessing shield/source region 288A and termination regions 288B and 288C to be below surface 154 of semiconductor material 152. By way of example, shield/source region 288A and termination regions 288B and 288C are recessed using an etch technique. The exposed portions of layer of dielectric material 186 over dielectric layer 184 and surface 154 are removed using, for example, a Reactive Ion Etch. The exposed portions of source/shield region 288A and termination regions 288B and 288C are oxidized to form inter-poly oxide layers 298A and 298B from the exposed polysilicon portions of termination regions 288B and 288C, respectively, and to form an inter-poly oxide layer 298C from the portions of shield/source region 288A exposed by trenches 230 and 232, respectively. Optionally, an oxide layer (not shown) may be formed over inter-poly oxide layers 298A-298C to fill any "fangs" or recesses that may be formed around inter-poly oxide layers 298A-298C. The optional oxide layer is then etched using, for example, an etch technique to expose portions of dielectric layer 184 over surface 154 and portions of dielectric layer 184 adjacent sidewalls 230S$_1$ and 232S$_2$.

Still referring to FIG. 13, the portions of dielectric layer 184 over surface 154, are removed using, for example, a Reactive Ion Etch. Thin high temperature oxide 197 is formed on the exposed portions of dielectric layer 182 and oxide layer 298C. Oxide layer 197 may be referred to as a layer of dielectric and the combination of oxide layer 197 and oxide layer 298C may be referred to as a composite gate oxide.

FIG. 12A is a cross-sectional view of semiconductor device 14 taken along section line C-C of FIG. 2. What is shown in FIG. 12A is termination trench 172A, i.e., portion 172A of the termination trench, and active trenches 170A and 170B. Dielectric layers 182, 184, and 186, and portion 188D of conductive layer 188 are formed in termination trench 172A. Similarly, dielectric layers 182, 184, and 186 are formed in trenches 170A and 170B. After processing, subportion 188A1 of electrically conductive material 188A remains in a bottom portion of trench 170A, wherein subportion 188A1 is electrically isolated from the sidewalls of trench 170A by portions of dielectric layers 182, 184, and 186. In addition, portion 197A1 of oxide layer 197 is formed on subportion 188A1. A subportion 200B1 of electrically conductive material 200B is formed in trench 170A, wherein subportion 200B1 is electrically isolated from the sidewalls of trench 170A and from subportion 188A1 of electrically conductive material 188A. Thus, subportion 188A1 serves as a gate shield and subportion 200B1 serves as a gate electrode.

Similarly, subportion 188A2 of electrically conductive material 188A remains in a bottom portion of trench 170B, wherein subportion 188A2 is electrically isolated from the sidewalls of trench 170B by portions of dielectric layers 182, 184, and 186. In addition, portion 197A2 of oxide layer 197 is formed on subportion 188A2. A subportion 200B2 of electrically conductive material 200B is formed in trench 170B, wherein subportion 200B2 is electrically isolated from the sidewalls of trench 170B and from subportion 188A2 of electrically conductive material 188A. Thus, subportion 188A2 serves as a gate shield and subportion 200B2 serves as a gate electrode.

Trench 170A is laterally spaced apart from trenches 172A and 170B by mesa structure 173A and 173B respectively. Trench 170B is laterally positioned between mesa structures 173B and 173C.

Figure 13A:
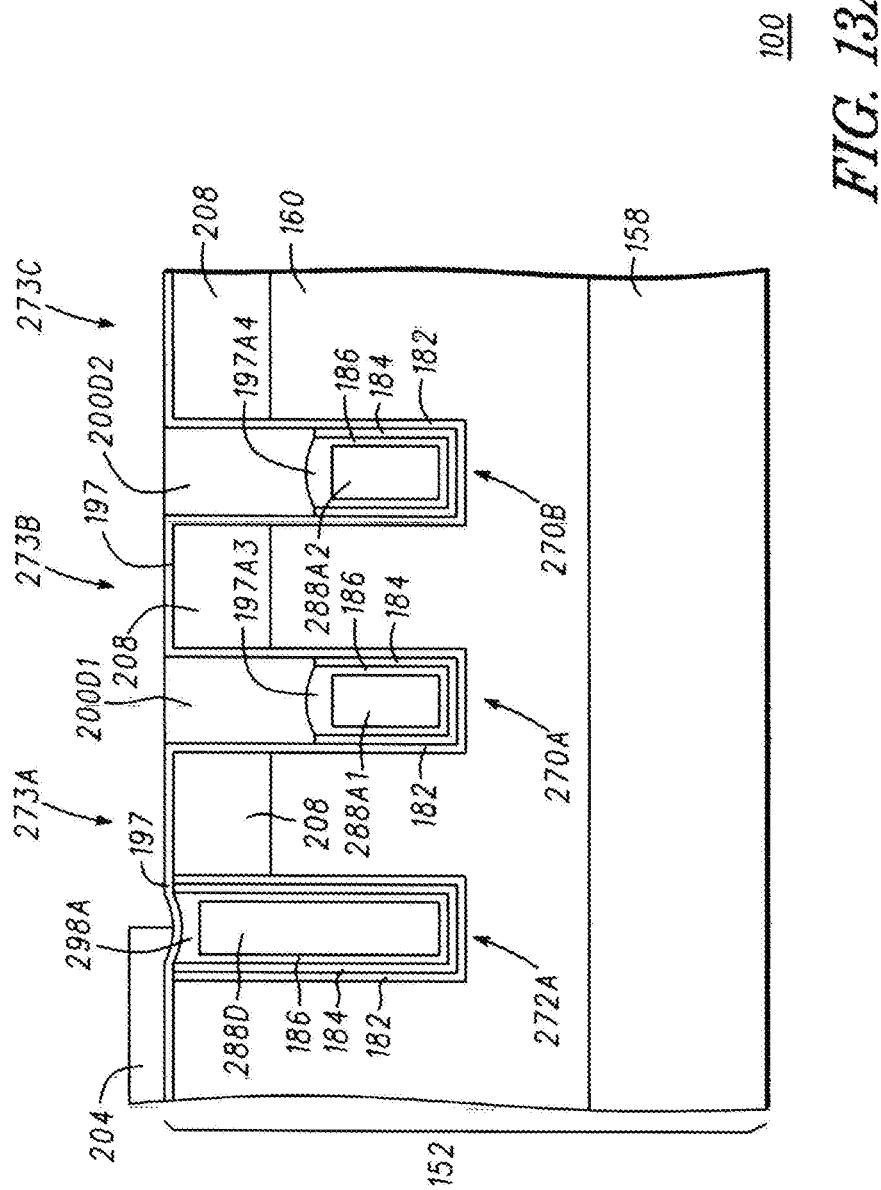
FIG. 13A is a cross-sectional view of the semiconductor component of FIG. 2 taken along section line D-D of FIG. 2, but at an earlier stage of manufacture.

FIG. 13A is a cross-sectional view of semiconductor device 16 taken along section line D-D of FIG. 2. What is shown in FIG. 13A is termination trench 272A, i.e., portion 272A of the termination trench, and active trenches 270A and 270B. Dielectric layers 182, 184, and 186, and portion 288D of conductive layer 288 are formed in termination trench 272A. Similarly, dielectric layers 182, 184, and 186 are formed in trenches 270A and 270B. After processing, subportion 288A1 of electrically conductive material 288A remains in a bottom portion of trench 270A, wherein subportion 288A1 is electrically isolated from the sidewalls of trench 270A by portions of dielectric layers 182, 184, and 186. In addition, portion 197A3 of oxide layer 197 is formed on subportion 288A1. A subportion 200D1 of electrically conductive material 200D is formed in trench 270A, wherein subportion 200D1 is electrically isolated from the sidewalls of trench 270A and from subportion 288A1 of electrically conductive material 288A. Thus, subportion 288A1 serves as a gate shield and subportion 200D1 serves as a gate electrode.

Similarly, subportion 288A2 of electrically conductive material 288A remains in a bottom portion of trench 270B, wherein subportion 288A2 is electrically isolated from the sidewalls of trench 270B by portions of dielectric layers 182, 184, and 186. In addition, portion 197A4 of oxide layer 197 is formed on subportion 288A2. A subportion 200D2 of electrically conductive material 200D is formed in trench 270B, wherein subportion 200D2 is electrically isolated from the sidewalls of trench 270B and from subportion 288A2 of electrically conductive material 288A. Thus, subportion 288A2 serves as a gate shield and subportion 200D2 serves as a gate electrode.

Trench 270A is laterally spaced apart from trenches 272A and 270B by mesa structure 273A and 273B respectively. Trench 270B is laterally positioned between mesa structures 273B and 273C.

Still referring to FIGS. 12, 12A, 13, and 13A, a layer of photoresist is patterned over the exposed portions of the composite gate oxide to form a masking structure 202 having masking elements 204 and openings 206 that expose portions of oxide layer 197 over mesa structures 271 and 273 and to expose subportions 200C and 200D and a portion of the composite gate oxide. It should be noted that a masking element 204 is not formed over trench 270, e.g., trenches 270A and 270B. An impurity material of P-type conductivity is implanted into mesa structures 271 and 273 to form dopant regions 208 and 210, respectively, and to form dopant regions 208 in mesa structures 273A, 273B, and 273C. By way of example, the impurity material of P-type conductivity may be, for example, boron or indium, that is implanted at a dose ranging from about $5\times10^{13}$ atoms per centimeter squared (atoms/cm$^2$) to about $5\times10^{14}$ atoms/cm$^2$ and an energy of at least 50 kilo electron volts. The concentration of P-type impurity material is increased to adjust the threshold voltage of protection device 16 so that III-N semiconductor device 14 shown in FIG. 1 turns off and holds the drain voltage applied to protection device 16.

Referring now to FIGS. 14, 14A, 15, and 15A, masking structure 202 is removed and a layer of photoresist is patterned over the exposed portions of the composite gate oxide to form a masking structure 212 having masking elements 214 and openings 216 that expose portions of the oxide layer 197 over mesa structures 171, 173, 271, and 273, portions of subportions 200A and 200B, and a portion of the composite gate oxide layer. It should be noted that a masking element 214 is not formed over trenches 170 and trenches 270. An impurity material of P-type conductivity is implanted into mesa structures 171, 173, 271, and 273 to form dopant regions 209 and 211 in mesa structures 171 and 173, respectively, and enhanced dopant regions 208E and 210E, in mesa structures 271 and 273, respectively. In addition, dopant regions 209 are formed in mesa structures 173A, 173B, and 173C and enhanced dopant regions 208E are formed in mesa structures 273A, 273B, and 273C. By way of example, the impurity material of P-type conductivity may be, for example, boron or indium, that is implanted at a dose ranging from about $5\times10^{12}$ atoms/cm$^2$ to about $5\times10^{13}$ atoms/cm$^2$ and an energy of at least 50 kilo electron volts. This implant serves as a body implant for both of semiconductor devices 12 and 16.

Figure 16:
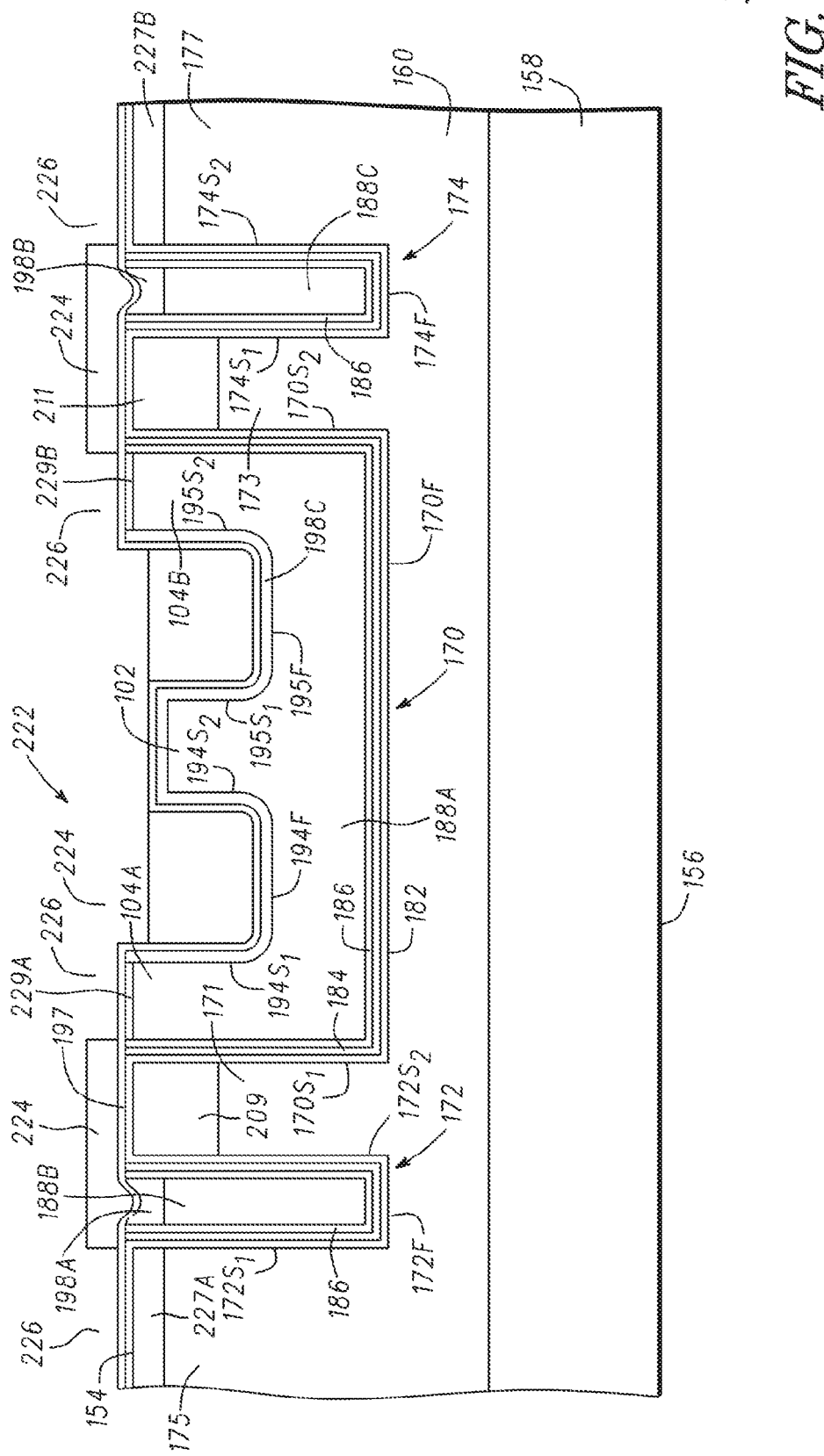
FIG. 16 is a cross-sectional view of the semiconductor component of FIG. 14 at a later stage of manufacture.
Figure 17:
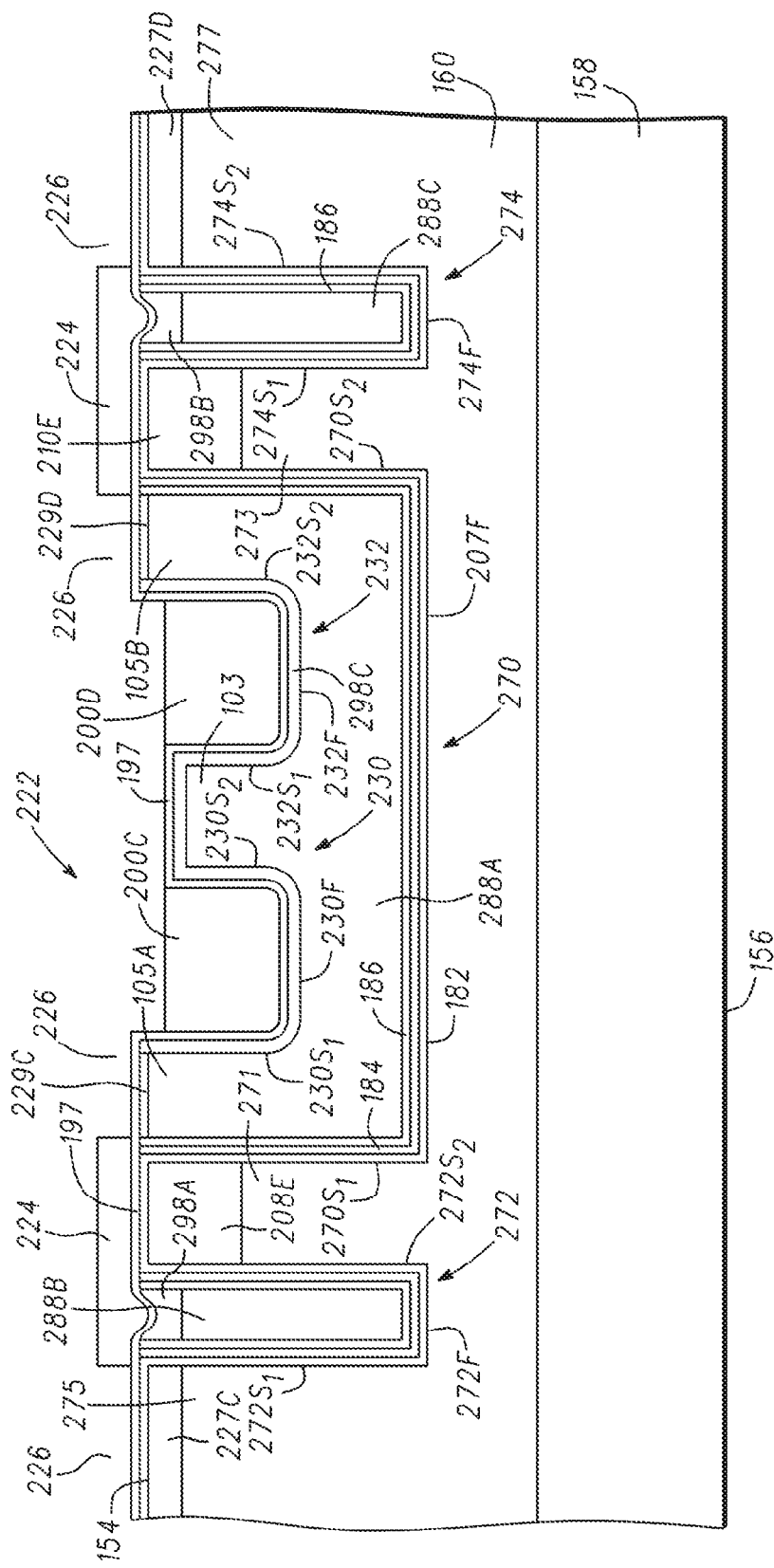
FIG. 17 is a cross-sectional view of the semiconductor component of FIG. 15 at a later stage of manufacture.

Referring now to FIGS. 16 and 17, masking structure 212 is removed and a layer of photoresist is patterned over the exposed portions of the composite gate oxide to form a masking structure 222 having masking elements 224 and openings 226 that expose portions of oxide layer 197 over mesa structures 175 and 177 and shield/source region 188A of semiconductor device 12 and openings that expose portions of the oxide layer 197 over mesa structures 273 and 275 and shield/source region 288A of semiconductor device 16. An impurity material of N-type conductivity is implanted into mesa structures 175, 177, 275, and 277 and shield/source regions 188A and 288A to form dopant regions 227A and 227B in mesa structures 175 and 177, respectively, dopant regions 227C and 227D in mesa structures 275 and 277, respectively, dopant regions 229A and 229B in shield/source region 188A, and dopant regions 229C and 229D in shield/source region 288A. By way of example, the impurity material of N-type conductivity may be, for example, phosphorus or arsenic, that is implanted at a dose ranging from about $5\times10^{14}$ atoms/cm$^2$ to about $5\times10^{15}$ atoms/cm$^2$ and an energy of at least 50 kilo electron volts. This implant serves as the source/drain implant for both of semiconductor devices 12 and 16.

Figure 18:
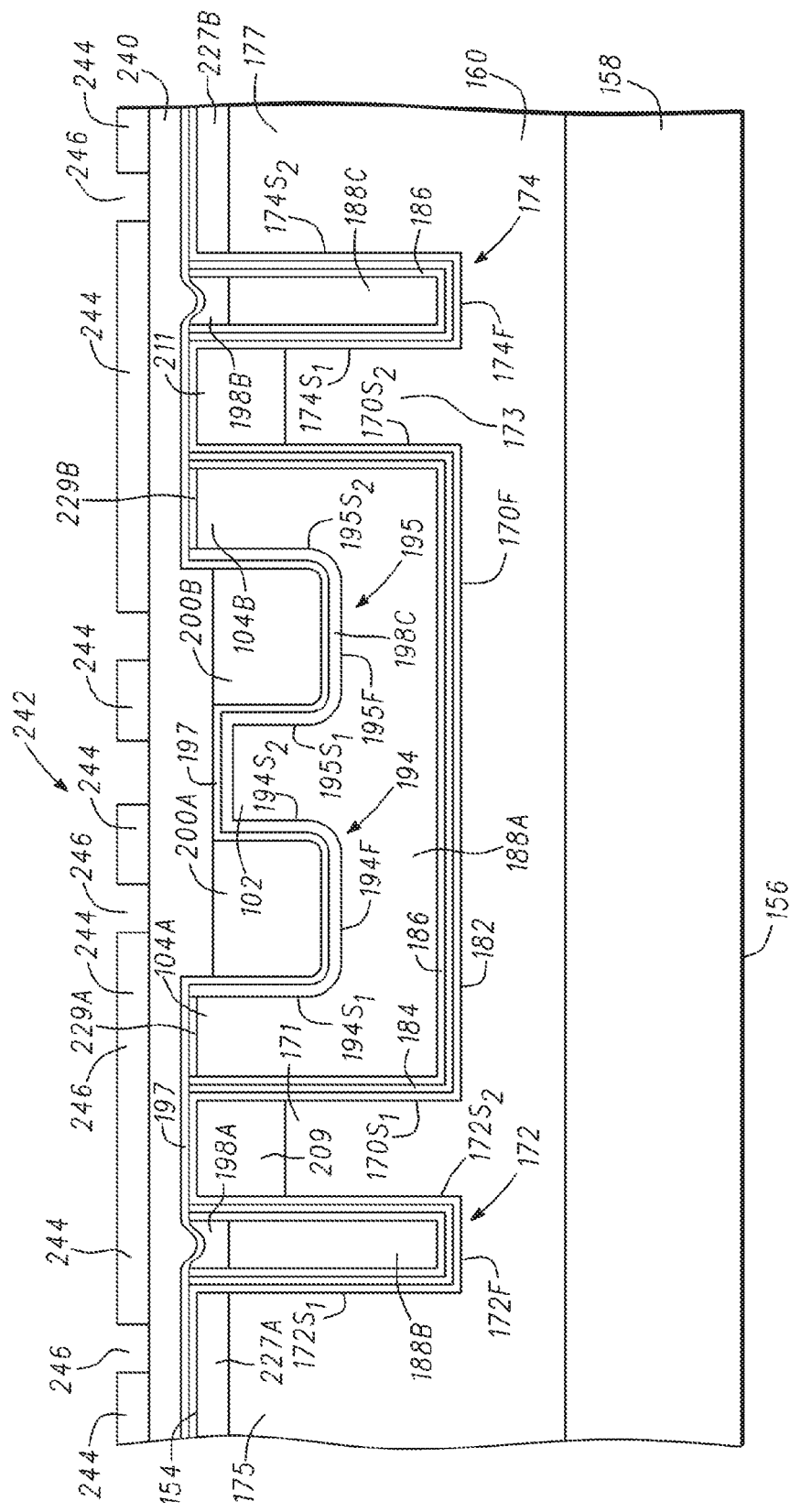
FIG. 18 is a cross-sectional view of the semiconductor component of FIG. 16 at a later stage of manufacture.
Figure 19:
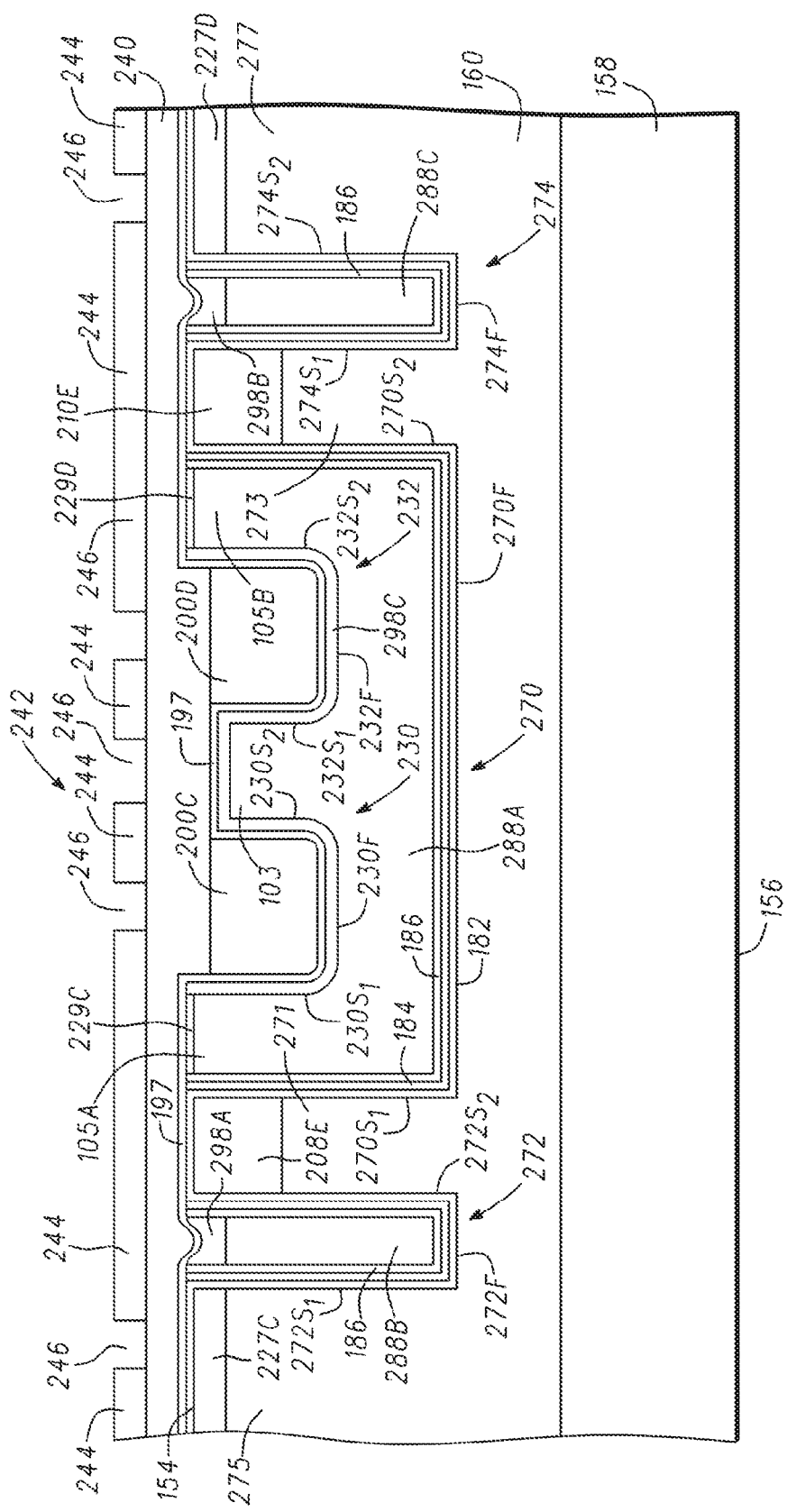
FIG. 19 is a cross-sectional view of the semiconductor component of FIG. 17 at a later stage of manufacture.

Referring now to FIGS. 18 and 19, masking structure 222 is removed and a layer of dielectric material 240 is formed on oxide 197, gate regions 200A and 200B of transistor 12, and gate regions 200C and 200D of transistor 16. In accordance with an embodiment, the material of dielectric layer 240 is silicon dioxide having a thickness ranging from about 500 Å to about 5,000 Å. Dielectric layer 240 may be formed by plasma enhanced chemical vapor deposition. Still referring to FIGS. 18 and 19, a layer of photoresist is patterned over dielectric layer 240 to form a masking structure 242 having masking elements 244 and openings 246 that expose portions of dielectric layer 220 over mesa structures 175, dopant regions 229A and 229B of transistor 12, gate regions 200A and 200B of transistor 12, mesa structures 275 and 277 of transistor 16, gate regions 200C and 200D of transistor 16.

Figure 20:
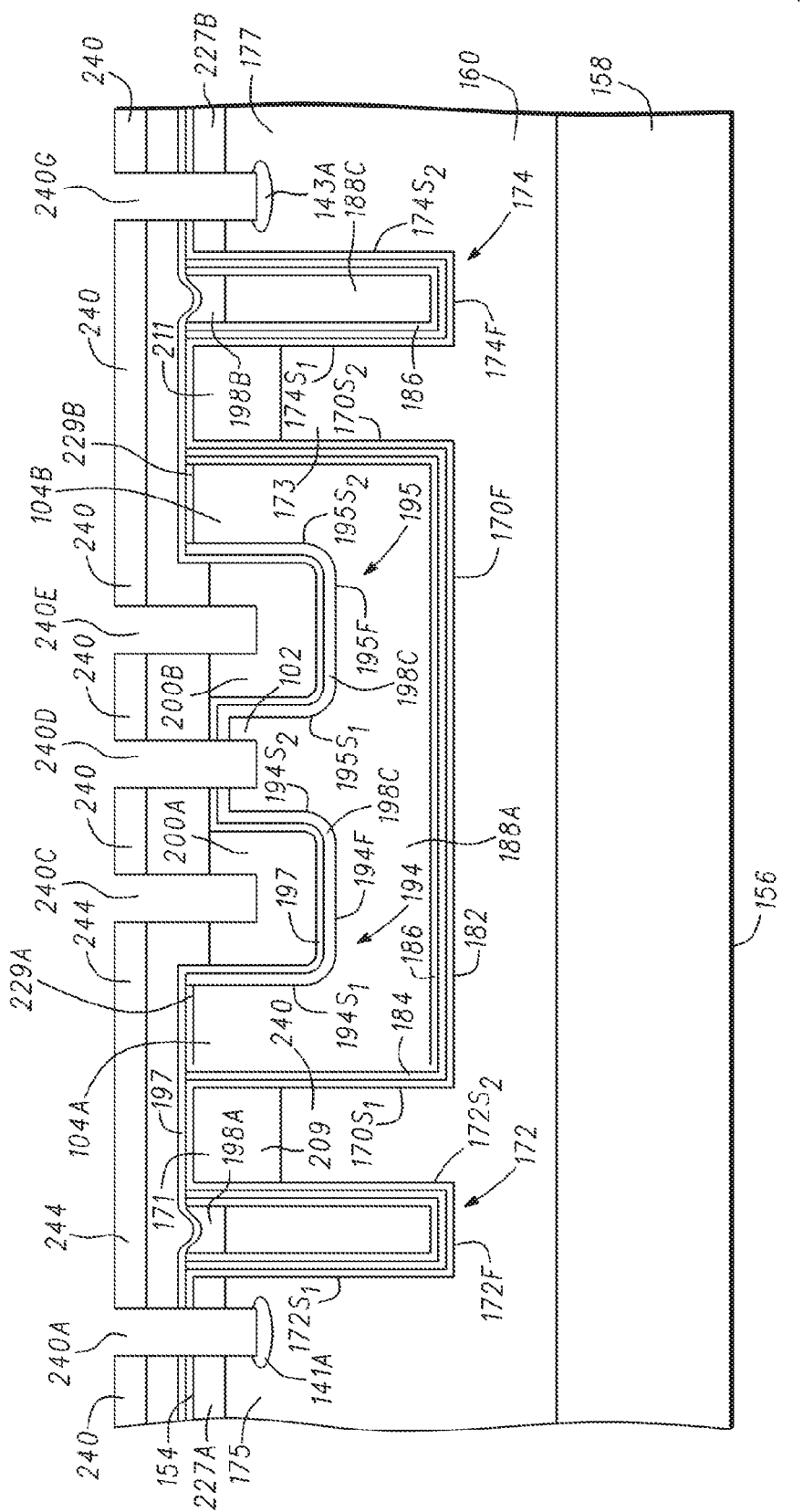
FIG. 20 is a cross-sectional view of the semiconductor component of FIG. 18 at a later stage of manufacture.
Figure 21:
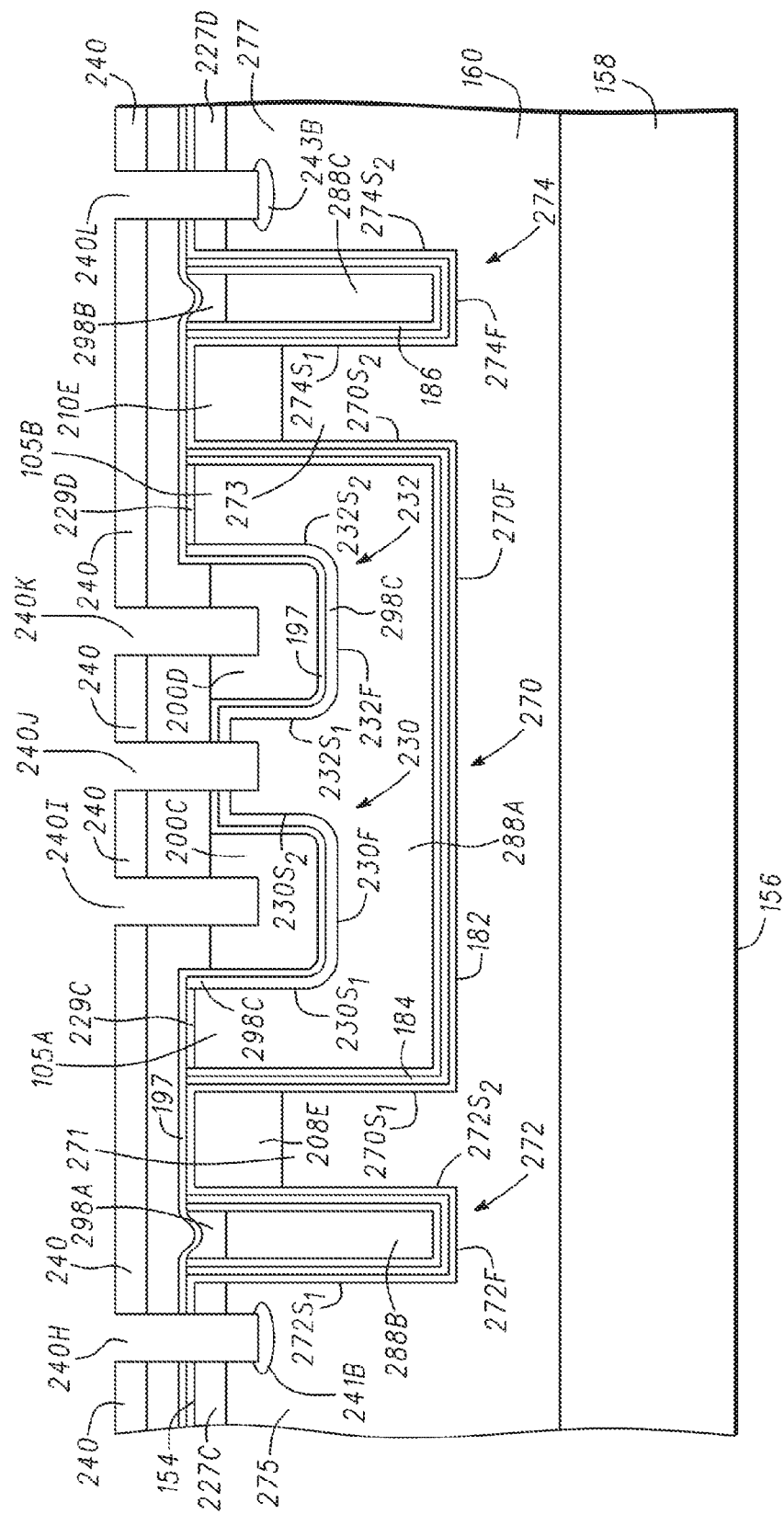
FIG. 21 is a cross-sectional view of the semiconductor component of FIG. 19 at a later stage of manufacture.

Referring now to FIGS. 20 and 21, the exposed portions of dielectric layer 240 are removed forming openings 240A, 240C, 240D, 240E, 240G, 240H, 240I, 240J, 240K and 240L. Opening 240A extends through dopant region 227A and into a portion of mesa structure 175; opening 240C extends into gate region 200A, opening 240D extends into portion 102 of shield/source region 188A, opening 240E extends into gate region 200B, and opening 240G extends through dopant region 227B and into a portion of mesa structure 177 of transistor 12. Opening 240H extends through dopant region 227C and into a portion of mesa structure 275; opening 240I extends into gate region 200C, opening 240J extends into a portion 103 of shield/source region 288A, opening 240K extends into gate region 200D, opening 240L extends through dopant region 227D and into a portion of mesa structure 277 of transistor 12. Masking structure 242 is removed.

An impurity material of P-type conductivity is implanted into dopant regions 227A, 227B, 227C, and 227D to form dopant regions 141A, 143A, 241B, and 243B in mesa structures 171, 173, 271, and 273, respectively. By way of example, the impurity of P-type conductivity may be, for example, boron or indium, that is implanted at a dose ranging from about $5\times10^{14}$ atoms/cm$^2$ to about $5\times10^{15}$ atoms/cm$^2$ and an energy of at least 50 kilo electron volts.

Figure 22:
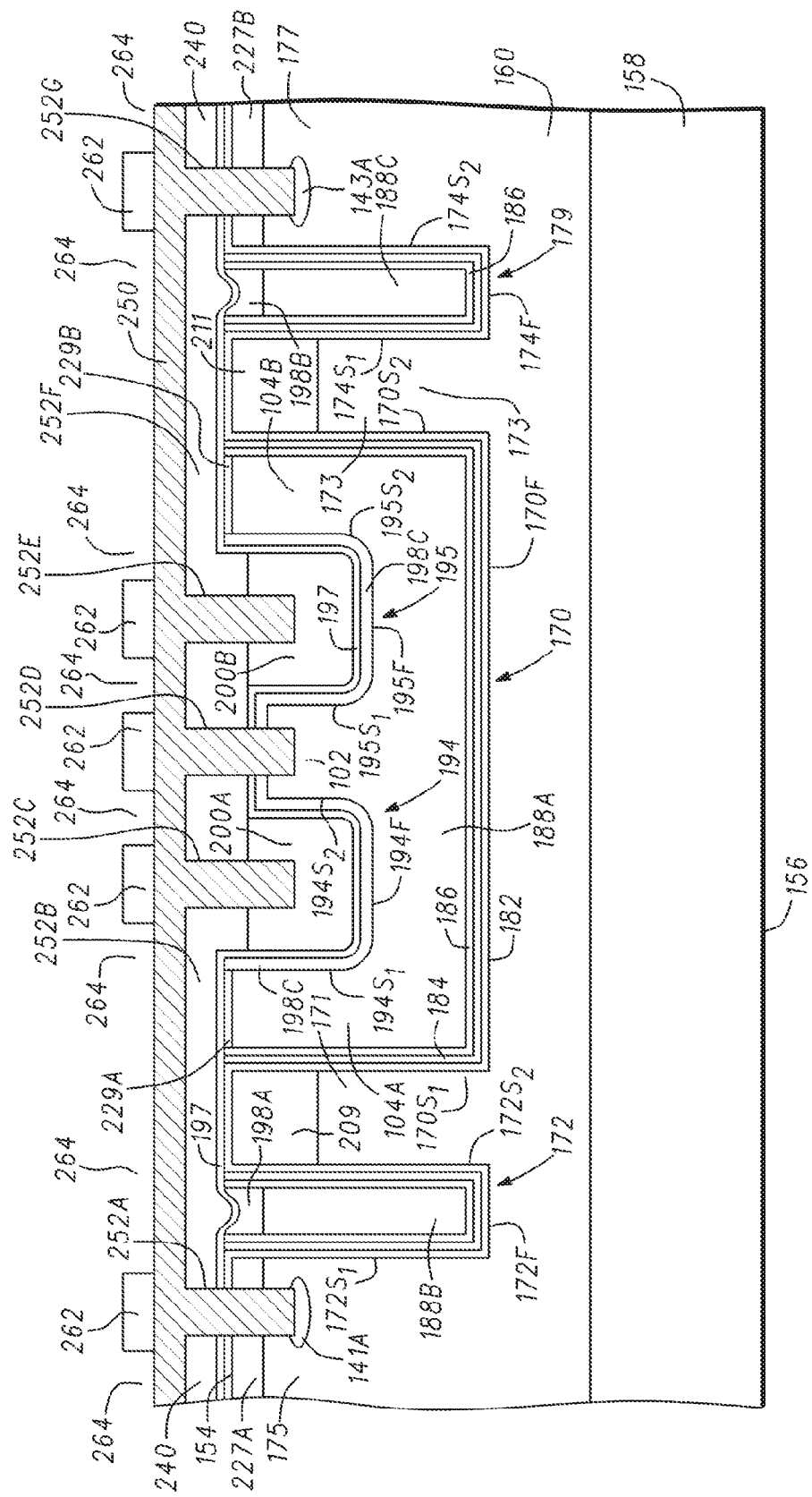
FIG. 22 is a cross-sectional view of the semiconductor component of FIG. 20 at a later stage of manufacture.
Figure 23:
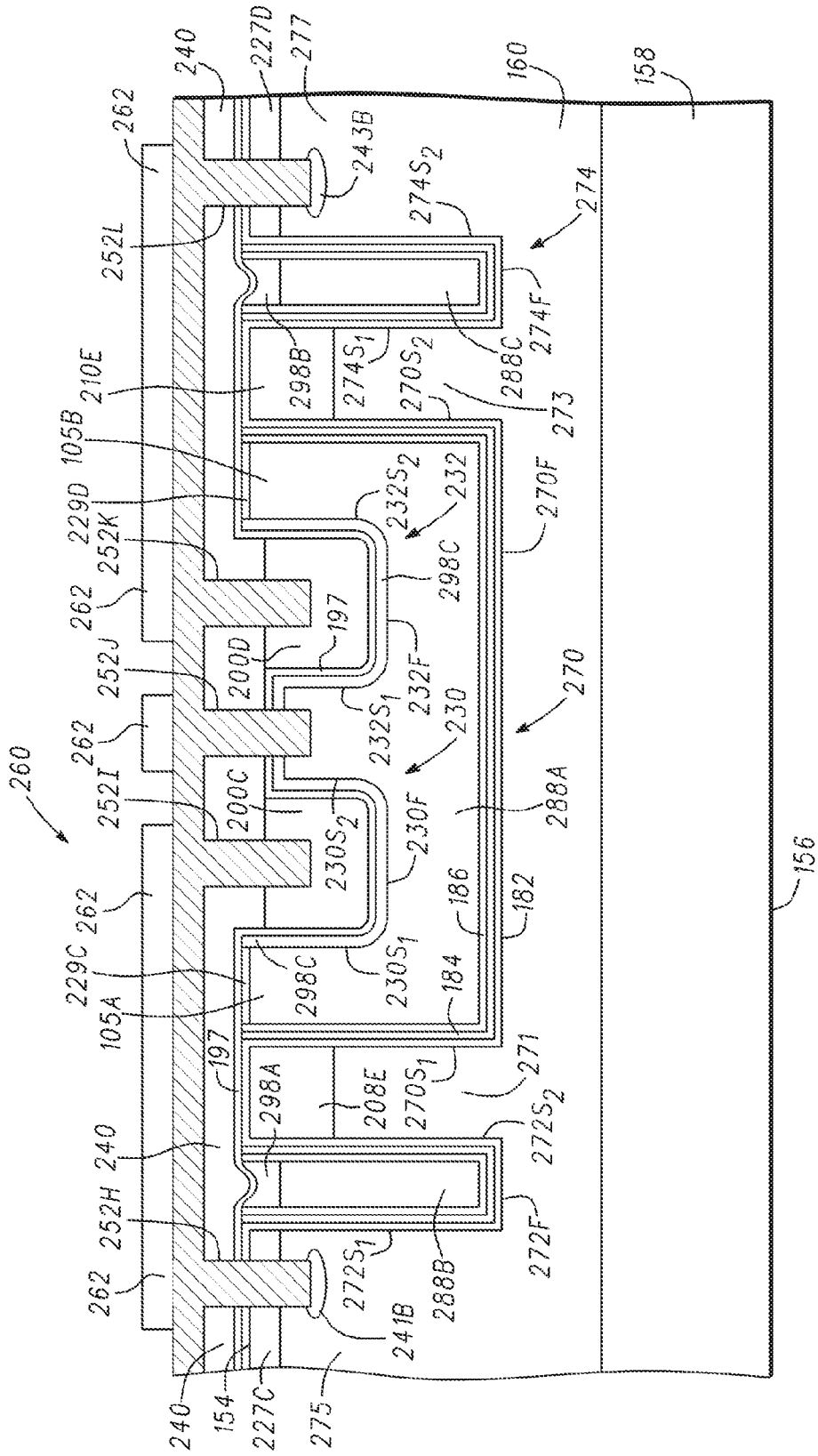
FIG. 23 is a cross-sectional view of the semiconductor component of FIG. 21 at a later stage of manufacture.

Referring now to FIGS. 22 and 23, a metallization system 250 is formed on dielectric layer 240 and fills openings 240A, 240C, 240D, 240E, 240G, 240H, 240I, 240J, 240K, and 240L. Portions of metallization system 250 form a contact 252A to mesa structure 175, a contact 252C to gate region 220A, a contact 252D to shield/source region 188A, a contact 252E to gate region 220B, a contact 252G to mesa structure 177, a contact 252H to mesa structure 275, a contact 252I to gate region 200C, a contact 252J to shield/source region 288A, a contact 252K to gate region 200D, and a contact 252J to mesa structure 277. Contacts 252C, 252E, 252I, and 252K may be referred to as gate contacts. Suitable materials for metallization system 250 include copper, aluminum, or the like. It should be appreciated that metallization system 250 is shown as a single layer of electrically conductive material for the sake of clarity. However, metallization system 250 may be comprised of a plurality of electrically conductive layers. For example, metallization system 250 may be comprised of a layer of refractory metal (not shown) deposited over dielectric layer 240 and on the portions of mesa structure 175, dopant region 229A of shield/source region 188A, shield/source region 188A, dopant region 229B of shield/source region 188A, mesa structure 177, mesa structure 275, dopant region 229C of shield/source region 288A, shield/source region 288A, dopant region 229D of shield/source region 288A, and mesa structure 277 exposed by openings 240A-240J, respectively. By way of example, the refractory metal is titanium having a thickness ranging from about 100 Å to about 1,000 Å. A rapid thermal anneal is performed wherein the refractory metal is heated to a temperature ranging from about 500° C. to about 700° C. The heat treatment causes the titanium to react with the silicon to form titanium silicide in all regions in which the titanium is in contact with silicon or polysilicon. Alternatively, the refractory metal can be titanium nitride, tungsten, cobalt, or the like. The silicide formed by the rapid thermal anneal serves as a barrier layer.

A barrier metal may be formed over dielectric layer 240 and on the exposed portions of mesa structure 175, dopant region 229A of shield/source region 188A, shield/source region 188A, dopant region 229B of shield/source region 188A, mesa structure 177, mesa structure 275, dopant region 229C of shield/source region 288A, shield/source region 288A, dopant region 229D of shield/source region 288A, and mesa structure 277 exposed by openings 240A-240J. It should be noted that the barrier metal may be comprised of a plurality of metal layers. A layer of aluminum copper (AlCu) is formed over the barrier metal layer. By way of example, the aluminum copper layer is sputtered onto the barrier metal layer and has a thickness ranging from about 1 micrometer (μm) to about 4 μm. Alternatively, the layer over the barrier metal layer may be aluminum, aluminum copper silicon, aluminum silicon, or the like. A layer of photoresist is patterned over metallization system 250 to form a masking structure 260 having masking elements 262 and openings 264, where openings 264 expose portions of metallization system 250.

Figure 24:
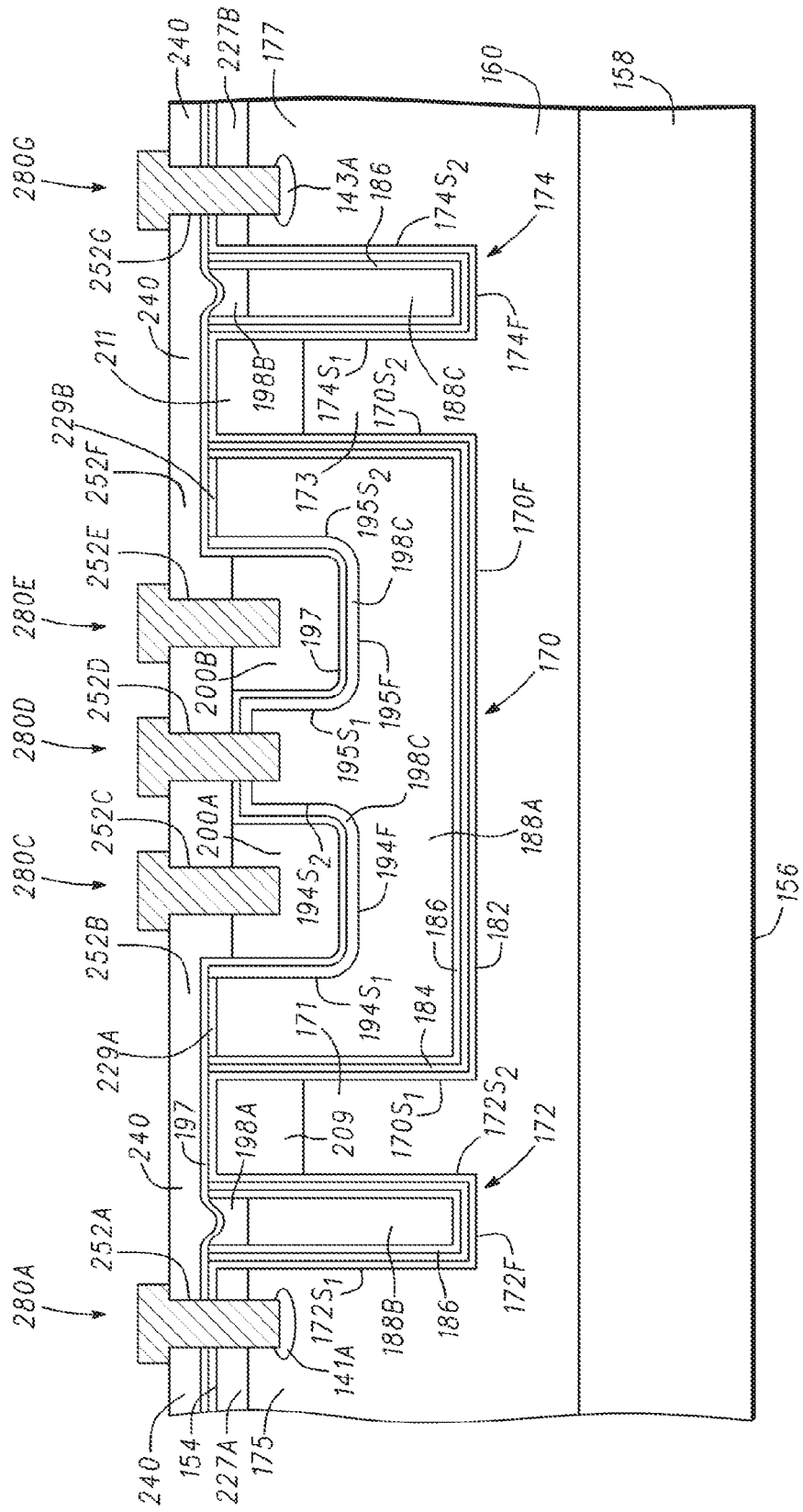
FIG. 24 is a cross-sectional view of the semiconductor component of FIG. 22 at a later stage of manufacture.
Figure 25:
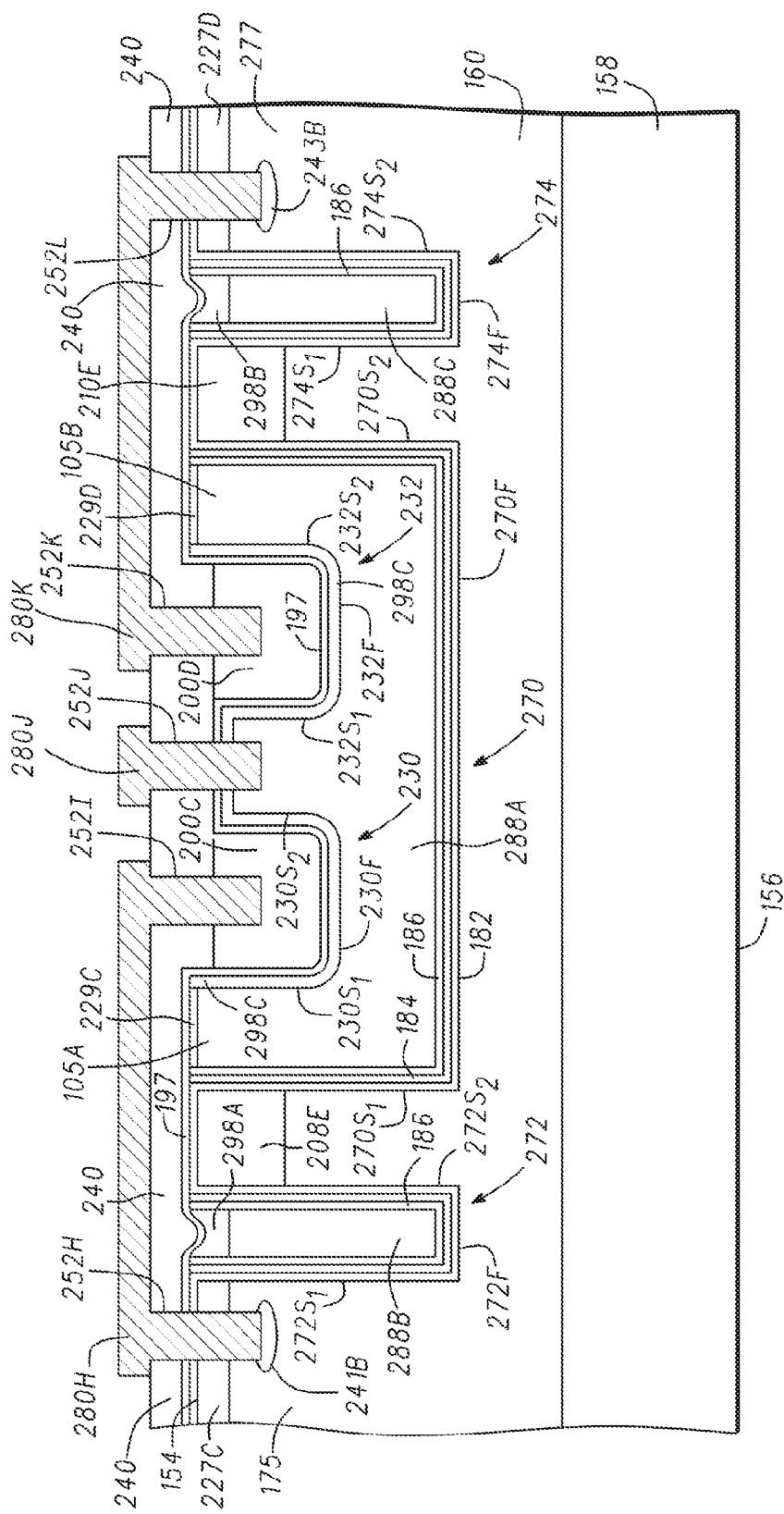
FIG. 25 is a cross-sectional view of the semiconductor component of FIG. 23 at a later stage of manufacture.

Referring now to FIGS. 24 and 25, the portions of metallization system 250 unprotected by masking elements 244, i.e., the portions of metallization system 250 exposed by openings 246, are removed using, for example, a Reactive Ion Etch. The portions of metallization system 250 that remain form electrically conductive interconnects 280A, 280C, 280D, 280E, and 280G for transistor 12 and interconnects 280H, 280J, and 280K for transistor 16.

Figure 26:
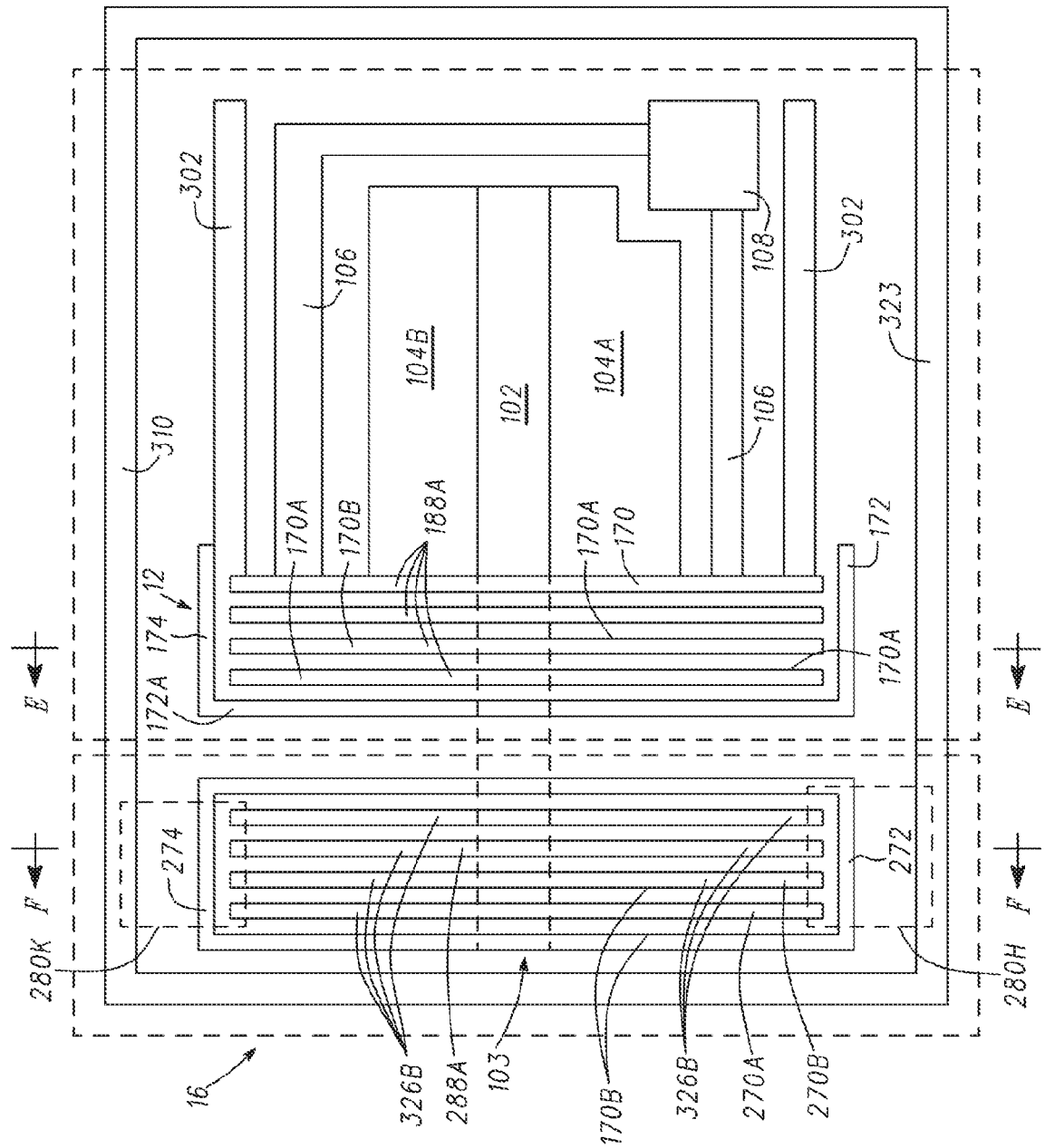
FIG. 26 is a layout of a portion of the semiconductor component of FIG. 1 in accordance with another embodiment of the present invention.

FIG. 26 is a top view of a semiconductor component 300 in accordance with another embodiment of the present invention. The top view shown in FIG. 26 may be referred to as a layout. What is shown in FIG. 26 is a layout of a transistor such as, for example, transistor 12 configured for use in a cascode device and transistor 16 configured for use as a clamping device. Transistor 12 may be referred to as a cascode device and includes a shield feed 102 between source pads 104A and 104B, a gate pad 108, a gate feed 106 surrounding source pads 104A and 104B, a source feed 302, and a drain ring 110 surrounding shield feed 102, source pads 104A and 104B, gate pad 108, gate feed 106, and a source feed 302. In addition, cascode device 12 includes active trenches 170 configured for containing portions of device 12 and termination trenches 172 and 174 configured for serving as termination structures.

Clamping device 16 includes a shield region 103 formed between source regions 105A and 105B, and drain ring 110 surrounding shield region 103 and source regions 105A and 105B. In addition, clamping device 16 includes an active trench 270 and termination trenches 272 and 274. Shield region 103, source regions 105A and 105B, drain ring 110, active trench 270, and termination trenches 272 and 274 are described with reference to FIGS. 13, 15, 17, 19, 21, 23, and 25. FIG. 26 further illustrates interconnects 280H and 280K that electrically connect the gate electrodes of transistor 16 to drain ring 110. Interconnects 280H and 280K are further described with reference to FIG. 28.

Figure 27:
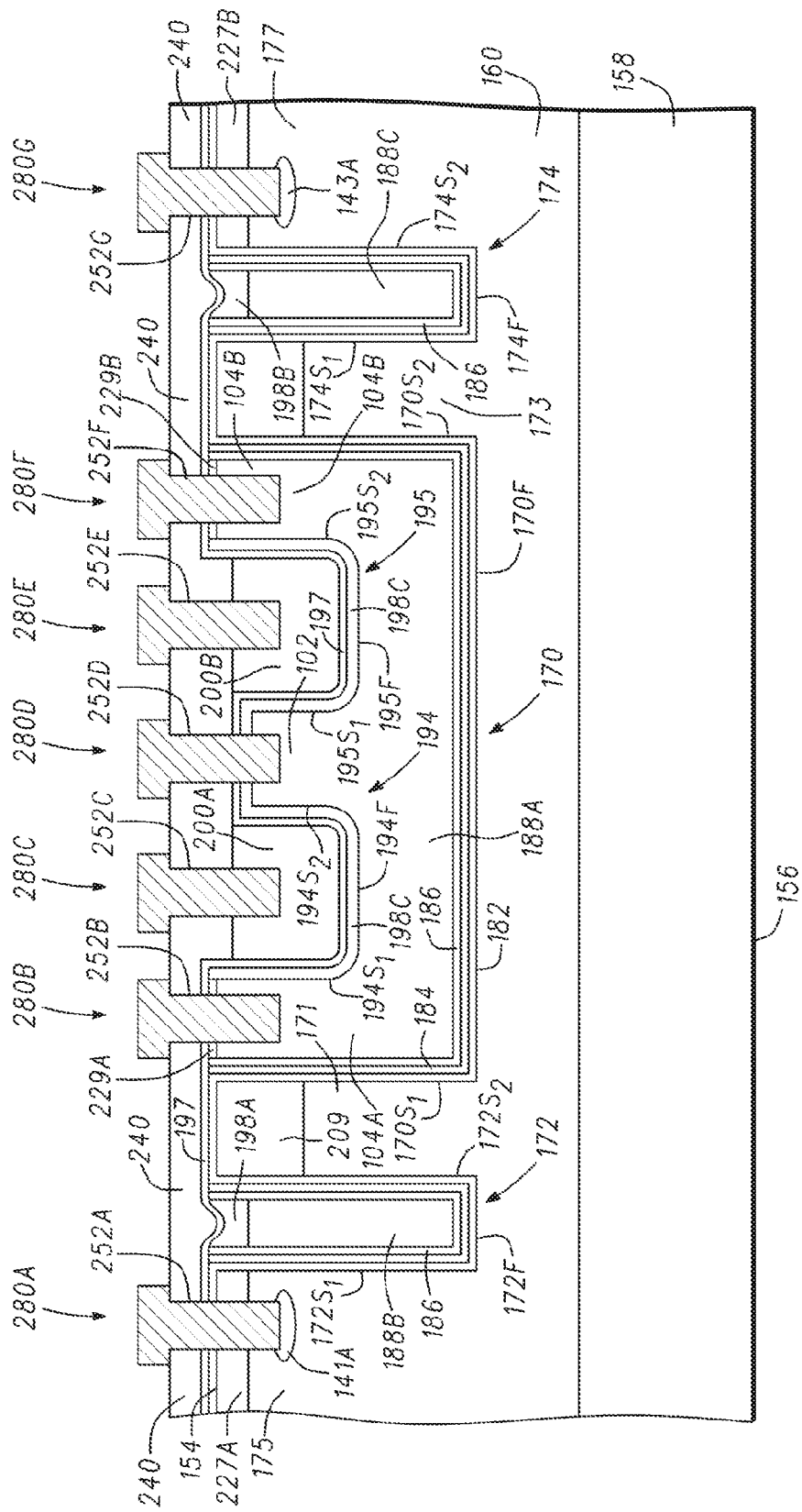
FIG. 27 is a cross-sectional view of the semiconductor component of FIG. 26 taken along a region of section line C-C of FIG. 26.

FIGS. 27 and 28 are cross-sectional views taken along section lines E-E and F-F of FIG. 26, respectively. Semiconductor component 300 is similar to semiconductor component 10 except that semiconductor component 300 includes additional contacts. More particularly, semiconductor component 300 includes an interconnect 280B in contact with dopant region 229A and shield/source region 188A and interconnect 280F in contact with dopant region 229B and shield/source region 188A. In addition, interconnect 280H is formed that couples drain ring 110 to gate electrodes 200C and an interconnect 280K is formed that couples drain ring 110 to gate electrodes 200D.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for monolithically integrating a semiconductor device with a protective device, comprising:
providing a semiconductor material of a first conductivity type having a first major surface opposite a second major surface, the semiconductor material of the first conductivity type having a first region and a second region;
forming the semiconductor device in the first region of the semiconductor material, wherein forming the semiconductor device comprises:
forming a first source region in a first portion of the first region;
forming a first gate electrode adjacent the first source region;
forming a drain ring to a second portion of the first region, the drain contact structure extending to at least a first portion of the second region;
forming the protective device in the second region of the semiconductor material, wherein forming the protective device comprises:
forming a second source region in a second portion of the second region;
forming a second gate electrode adjacent the second source region; and
coupling the second gate electrode to the drain ring; and
coupling the first source electrode and the second source electrode for receiving a first source of operating potential so that the semiconductor device and the protective device are coupled in parallel.

2. The method of claim 1, wherein forming the drain ring comprises forming the drain ring to surround the first portion of the first region and the second portion of the second region of the semiconductor material.

3. The method of claim 1, further including:
forming a first device trench in a first subportion of the first portion of the first region, the first device trench having a first sidewall, a second sidewall, and a floor;
forming a first termination trench in a second subportion of the first portion of the first region; and
forming a first conductive material in the first device trench and in the first termination trench.

4. The method of claim 3, further including:
forming the first gate electrode in a first portion of the first device trench; and
forming a first gate contact to the first gate electrode.

5. The method of claim 4, wherein forming the first gate electrode in the first portion of the first device trench comprises:
removing a first portion of the first conductive material from the first device trench to form a first recessed portion in the first conductive material, the first recessed portion having a first surface;

removing a second portion of the first conductive material from the first device trench to form a second recessed portion in the first conductive material, the second recessed portion having a second surface, wherein removing the first portion and the second portion of the first conductive material leaves a first mesa structure between the first recessed portion and the second recessed portion, wherein the first mesa structure serves as a first shield region;

forming a first dielectric material over the first surface of the first recessed portion and over the second surface of the second recessed portion; and forming a second conductive material over the first dielectric material over the first surface of the first recessed portion and over the second surface of the second recessed portion, a portion of the second conductive material serving as the first gate electrode and another portion of the second conductive material serving as another first gate electrode.

6. The method of claim 5, further including:
forming a second device trench in a first subportion of the second portion of the second region, the second device trench having a first sidewall, a second sidewall, and a floor;
forming a second termination trench in a second subportion of the second portion of the semiconductor material; and
forming the first conductive material in the second device trench and in the second termination trench.

7. The method of claim 6, further including:
forming a second gate electrode in a first portion of the second device trench; and
forming a second gate contact to the second gate electrode.

8. The method of claim 7, wherein forming the second gate electrode in the first portion of the second device trench comprises:
removing a third portion of the first conductive material from the second device trench to form a third recessed portion in the first conductive material, the third recessed portion in the first conductive material having a third surface;
removing a fourth portion of the first conductive material from the second device trench to form a fourth recessed portion in the first conductive material, the fourth recessed portion having a fourth surface, wherein removing the third portion and the fourth portion of the first conductive material leaves a second mesa structure between the third recessed portion and the fourth recessed portion, wherein the second mesa structure serves as a second shield region;
forming a second dielectric material over the third surface of the third recessed portion and the fourth surface of the fourth recessed portion in the first conductive material;
forming the second conductive material over the second dielectric material, the second conductive material over the second dielectric material serving as the second gate electrode and another portion of the second conductor material serving as another second gate electrode.

9. The method of claim 8 further including doping a body region of the protective device so that a concentration of an impurity material in the body region of the protective device is higher than the concentration of the impurity material in a body region of the semiconductor device.

10. The method of claim 9, further including adjusting a threshold voltage of the protective device to be higher than an absolute value of the threshold voltage of a III-N device coupled to the semiconductor device in the cascode configuration.

11. The method of claim 10, wherein adjusting the threshold voltage of the protective device includes doping the portion of the semiconductor material between the second device trench and the second termination trench with an impurity material of a second conductivity type.

12. A method for manufacturing a semiconductor component, comprising:
providing a semiconductor material of a first conductivity type;
forming a first device trench in a first portion of the semiconductor material;
forming a first protective device trench in a second portion of the semiconductor material;
forming a first layer of dielectric material in the first device trench and in the first protective device trench, wherein the first layer of dielectric material includes a first portion and a second portion, the first portion of the first layer of dielectric material in the first device trench and the second portion of the first layer of dielectric material in the first protective device trench;
forming a first layer of conductive material over the first layer of dielectric material, the first layer of conductive material having a first portion and a second portion, the first portion of the first layer of conductive material over the first portion of the first layer of dielectric material and the second portion of the first layer of conductive material over the second portion of the first layer of dielectric material;
forming a first source structure from the first portion of the first layer of conductive material;
forming a second source structure from the second portion of the first layer of conductive material;
forming a first gate structure over the first source structure;
forming a second gate structure over the second source structure;
forming a drain ring over the semiconductor material of the first conductivity type, wherein the first gate structure, the first source structure, and a first portion of the drain ring form a first device and the second gate structure, the second source structure, and a second portion of the drain ring form a protective device structure;
coupling the first source structure and the second source structure for receiving a first source of operating potential; and
coupling the second gate structure to the drain ring so that the semiconductor device and the protective device are coupled in parallel.

13. The method of claim 12, further including forming a first dopant region adjacent the second portion of the semiconductor material and adjacent to the first protective device trench, the second dopant region having a concentration of impurity material of a second conductivity type configured to set a threshold voltage of a transistor that is configured to be a protective device to be higher than an absolute voltage of the III-N semiconductor device.

14. The method of claim 13, further including:
forming a first termination trench in the first portion of the semiconductor material;
forming a second termination trench in the second portion of the semiconductor material, wherein forming the first layer of dielectric material in the first device trench and in the first protective device trench includes forming the first layer of dielectric material to have a third portion and a fourth portion, the third portion of the first layer of dielectric material in the first termination trench and the fourth portion of the first layer of dielectric material in the second termination trench; and wherein forming the first layer of conductive material over the first layer of dielectric material includes forming the first layer of conductive material to have a third portion and a fourth portion, the third portion of the first layer of conductive material over the third portion of the first layer of dielectric material in the first termination trench and the fourth portion of the first layer of conductive material over the fourth portion of the first layer of dielectric material in the second termination trench.

15. The semiconductor component of claim 5 further including forming a first shield electrode in contact with the first mesa structure.

16. A method for manufacturing a semiconductor component having a first semiconductor device monolithically integrated with a second semiconductor device, wherein the second semiconductor device serves to protect the semiconductor component comprising:
  providing a semiconductor material of a first conductivity type having a first major surface opposite a second major surface;
  forming the first semiconductor device in a first portion of the semiconductor material, wherein forming the first semiconductor device comprises:
    forming a first source region in a first subportion of the first portion of the semiconductor material;
    forming a first shield region in a second subportion of the first portion of the semiconductor material;
    forming a first gate electrode adjacent the first source region;
    forming a drain region in a third subportion of the first portion of the semiconductor material;
  forming the second semiconductor device in second portion of the semiconductor material, wherein forming the second semiconductor device comprises:
    forming a second source region in a first subportion of the second portion of the semiconductor material;
    forming a second shield region in a second subportion of the second portion of the semiconductor material;
    forming a second gate electrode adjacent the second source region;
    wherein forming the drain region in the third subportion of the first portion of the semiconductor material further includes forming the drain region in a third portion of the second portion of the semiconductor material;
  coupling the second gate electrode to the drain region; and
    coupling the first source region and the second source region for receiving a first source of operating potential so that the first semiconductor device and the second device are coupled in parallel.

17. The method of claim 16, further including forming the second semiconductor device and the first semiconductor device so that the threshold voltage of the second semiconductor device is less than a breakdown voltage of the first semiconductor device.

18. The method of claim 17, further including:
  providing a third semiconductor device having a gate, a drain, and a source;
  coupling the gate of the third semiconductor device to the source of the first semiconductor device, coupling the source of the third semiconductor device to the drain regions of the first and second semiconductor device and to the gate electrode of the second semiconductor device.

19. The method of claim 18, further including forming the second semiconductor device to have a threshold voltage that is greater than an absolute value of the threshold voltage of the third semiconductor device.

20. The method of claim 16, wherein
  forming the first semiconductor device further includes:
  forming the first semiconductor device further comprises:
    forming a third source region in a fourth subportion of the first portion of the semiconductor material;
    forming a third shield region in a fifth subportion of the first portion of the semiconductor material, wherein the third shield region is between the first source region and the third source region;
    forming a third gate electrode adjacent the third source region, wherein first shield region is between the first gate electrode and the third gate electrode; and wherein:
  forming the second semiconductor device further comprises:
    forming a fourth source region in a fourth subportion of the second portion of the semiconductor material;
    forming a fourth shield region in a fifth subportion of the second portion of the semiconductor material;
    forming a fourth gate electrode adjacent the fourth source region, wherein fourth shield region is between the third gate electrode and the fourth gate electrode.

* * * * *